United States Patent
Lee et al.

(10) Patent No.: US 11,063,152 B2
(45) Date of Patent: Jul. 13, 2021

(54) SEMICONDUCTOR DEVICE AND METHOD

(71) Applicant: Taiwan Semiconductor Manufacturing Company, Ltd., Hsinchu (TW)

(72) Inventors: Chien-Wei Lee, Kaohsiung (TW); Hsueh-Chang Sung, Zhubei (TW); Yen-Ru Lee, Hsinchu (TW); Jyun-Chih Lin, Hsinchu (TW); Tzu-Hsiang Hsu, Xinfeng Township (TW); Feng-Cheng Yang, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 9 days.

(21) Appl. No.: 16/547,191

(22) Filed: Aug. 21, 2019

(65) Prior Publication Data

US 2021/0057567 A1 Feb. 25, 2021

(51) Int. Cl.
*H01L 29/78* (2006.01)
*H01L 29/08* (2006.01)
*H01L 29/66* (2006.01)

(52) U.S. Cl.
CPC ........ *H01L 29/785* (2013.01); *H01L 29/0847* (2013.01); *H01L 29/6681* (2013.01); *H01L 29/66545* (2013.01)

(58) Field of Classification Search
CPC ... H01L 23/528; H01L 21/311; H01L 27/108; H01L 21/76; H01L 221/0337
See application file for complete search history.

(56) References Cited

U.S. PATENT DOCUMENTS

| | | | |
|---|---|---|---|
| 9,275,834 B1 * | 3/2016 | Park | H01J 37/3244 |
| 2015/0318215 A1 * | 11/2015 | Taylor, Jr. | H01L 21/3083 257/506 |
| 2018/0090315 A1 * | 3/2018 | Bi | H01L 29/66545 |
| 2019/0115263 A1 * | 4/2019 | Bi | H01L 21/30604 |
| 2019/0140064 A1 * | 5/2019 | Bi | H01L 29/0847 |

* cited by examiner

*Primary Examiner* — Zandra V Smith
*Assistant Examiner* — Andre C Stevenson
(74) *Attorney, Agent, or Firm* — Slater Matsil, LLP

(57) ABSTRACT

A semiconductor device including a source/drain region having a V-shaped bottom surface and extending below gate spacers adjacent a gate stack and a method of forming the same are disclosed. In an embodiment, a method includes forming a gate stack over a fin; forming a gate spacer on a sidewall of the gate stack; etching the fin with a first anisotropic etch process to form a first recess adjacent the gate spacer; etching the fin with a second etch process using etchants different from the first etch process to remove an etching residue from the first recess; etching surfaces of the first recess with a third anisotropic etch process using etchants different from the first etch process to form a second recess extending below the gate spacer and having a V-shaped bottom surface; and epitaxially forming a source/drain region in the second recess.

20 Claims, 23 Drawing Sheets

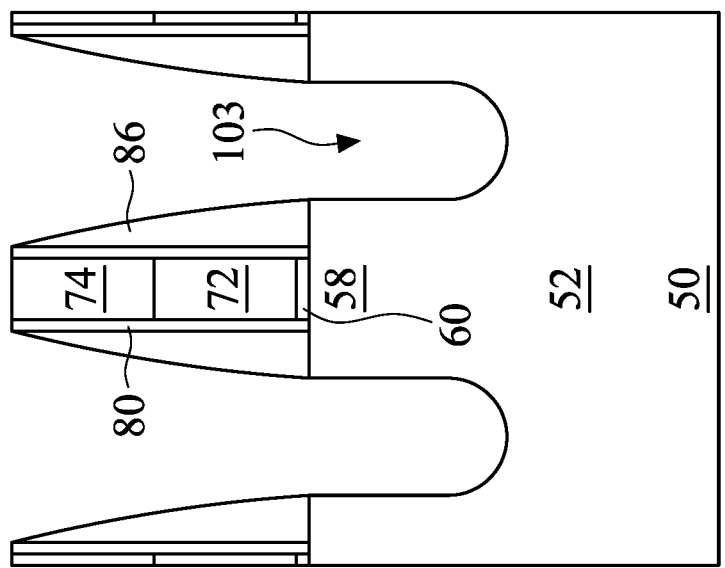
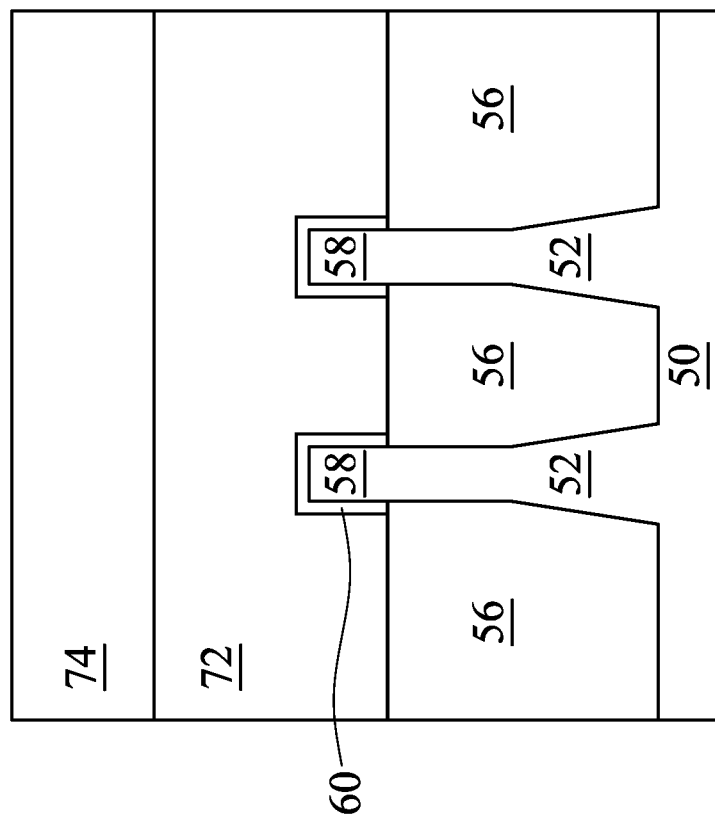
Figure 11B
Figure 11A

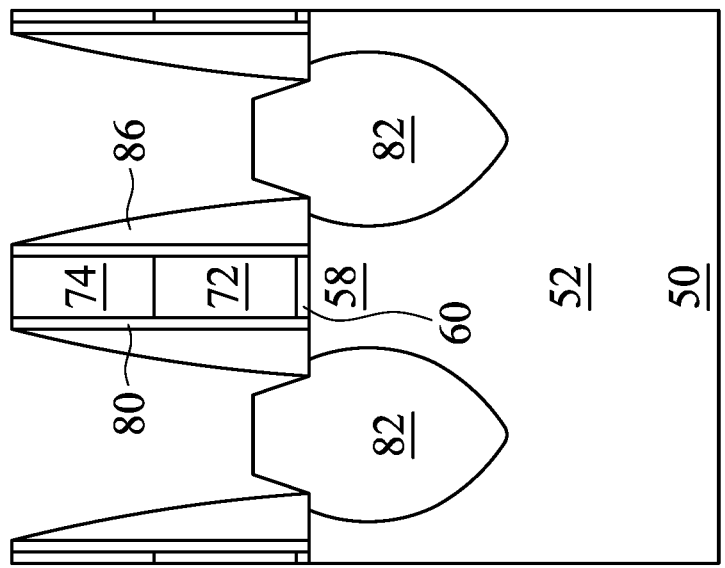
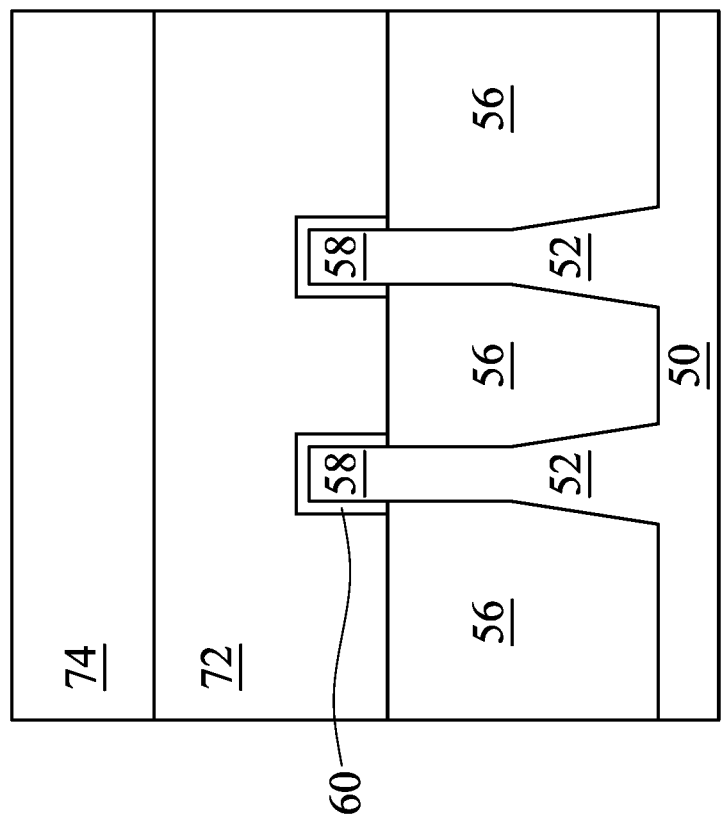
Figure 14A
Figure 14B

SEMICONDUCTOR DEVICE AND METHOD

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 11A, 11B, 12A, 12B, 14A, 14B, 14C, 14D, 15A, 15B, 16A, 16B, 17A, 17B, 18A, 18B, 18C, 19A, 19B, 20A, and 20B are cross-sectional views of intermediate stages in the manufacturing of FinFETs, in accordance with some embodiments.

DETAILED DESCRIPTION

Figure 1:
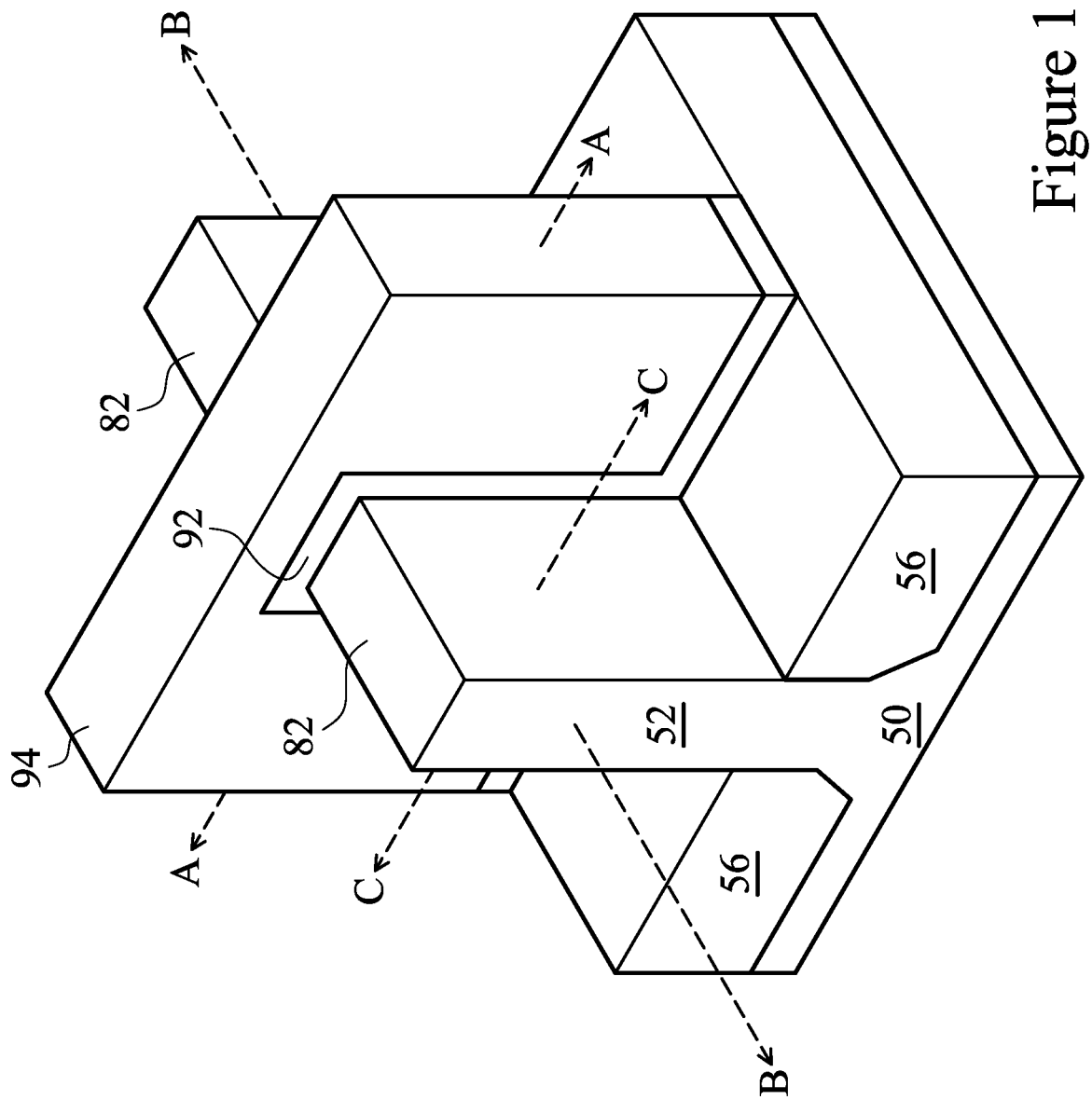
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved source/drain regions and methods of forming the same for use in semiconductor devices. The source/drain regions may be formed by etching recesses in semiconductor fins using an anisotropic etch process, removing an etching residue from the recesses using ammonia-based etching, and expanding the recesses using hydrogen-based plasma etching. The completed recesses may have V-shaped bottom surfaces and may extend under gate spacers. Source/drain regions are then formed in the recesses. Semiconductor devices including the source/drain regions may have improved $I_{on}$-$I_{off}$ (e.g., high on current $I_{on}$ and low leakage current $I_{off}$), reduced drain induced barrier lower (DIBL) effects, reduced device defects, and overall improved device performance.

FIG. 1 illustrates an example of a FinFET in a three-dimensional view, in accordance with some embodiments. The FinFET comprises a fin 52 on a substrate 50 (e.g., a semiconductor substrate). Shallow trench isolation (STI) regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring STI regions 56.

A gate dielectric layer 92 is along sidewalls and over a top surface of the fin 52, and a gate electrode 94 is over the gate dielectric layer 92. Epitaxial source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the epitaxial source/drain regions 82 of the FinFET. Cross-section B-B is perpendicular to cross-section A-A and is along a longitudinal axis of the fin 52 and in a direction of, for example, a current flow between the epitaxial source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 14C:
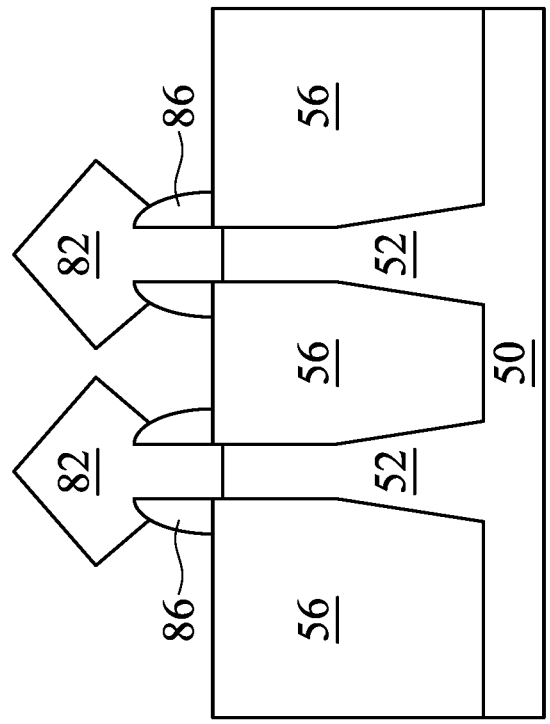
Figure 14D:
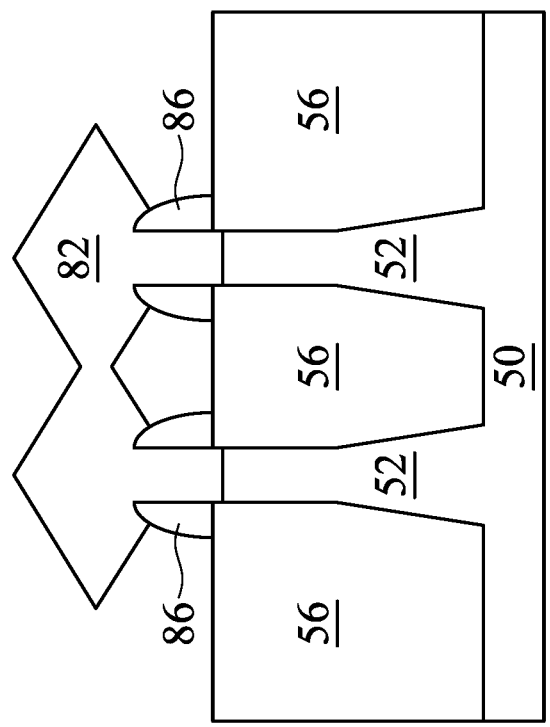

FIGS. 2 through 12B and 14A through 20B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 14A, 15A, 16A, 17A, 18A, 19A, and 20A are illustrated along reference cross-section A-A illustrated in FIG. 1, and FIGS. 8B, 9B, 10B, 11B, 12B, 14B, 15B, 16B, 17B, 18B, 18C, 19B, and 20B are illustrated along a similar cross-section B-B illustrated in FIG. 1, except for multiple fins/FinFETs. FIGS. 14C and 14D are illustrated along reference cross-section C-C illustrated in FIG. 1, except for multiple fins/FinFETs.

Figure 2:
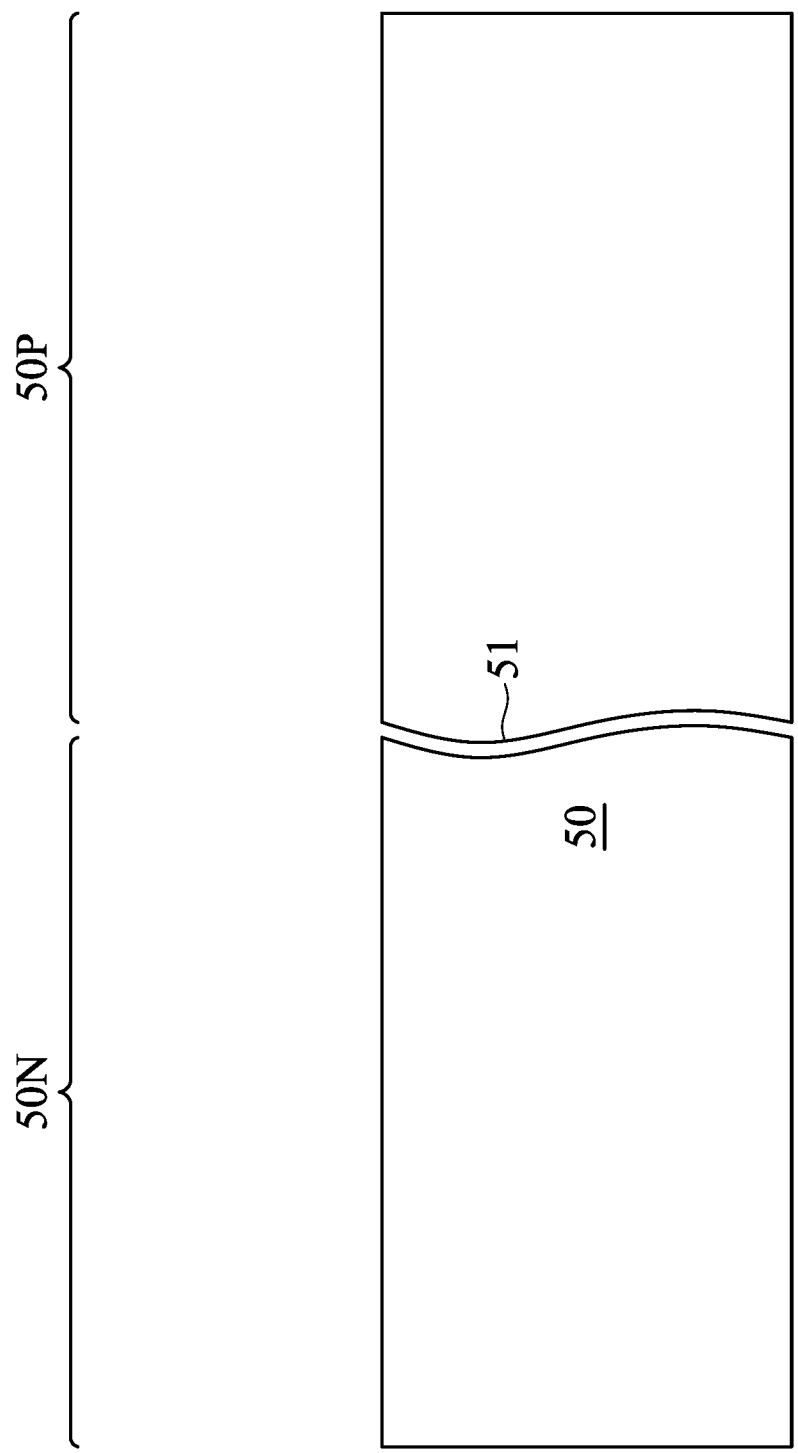

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
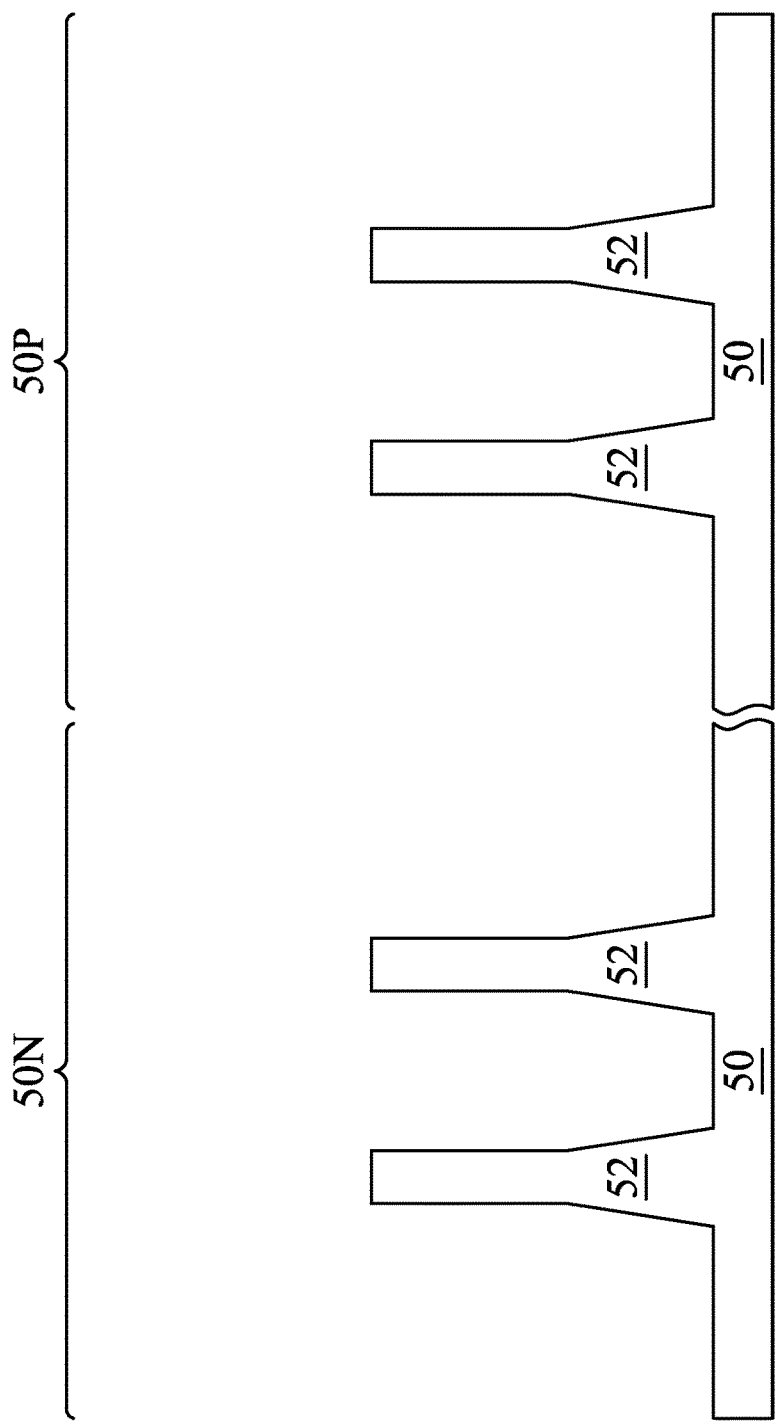

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
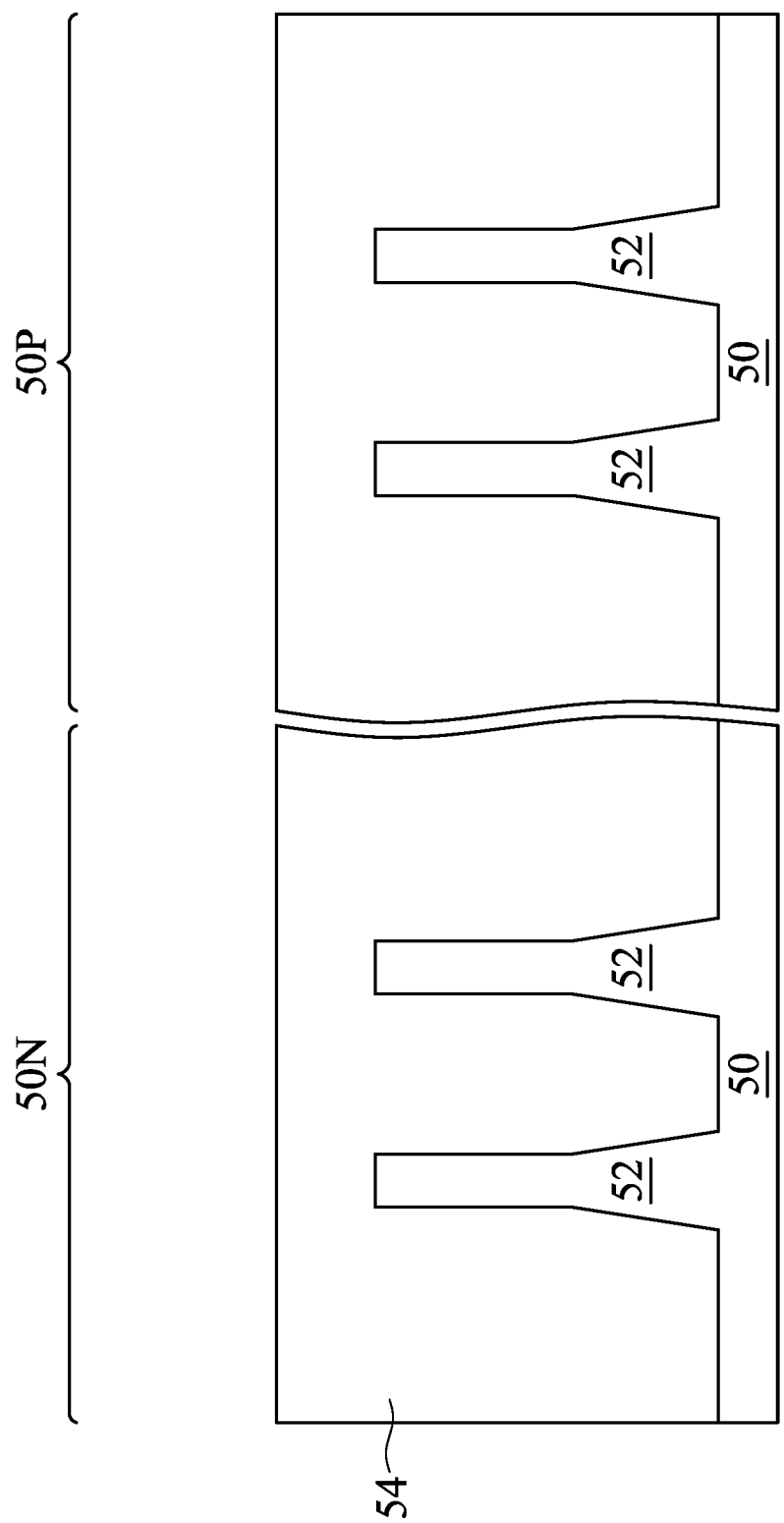

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition-based (CVD-based) material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not separately illustrated) may first be formed along a surface of the substrate 50 and the fins 52. Thereafter, a fill material, such as those discussed above may be formed over the liner.

Figure 5:
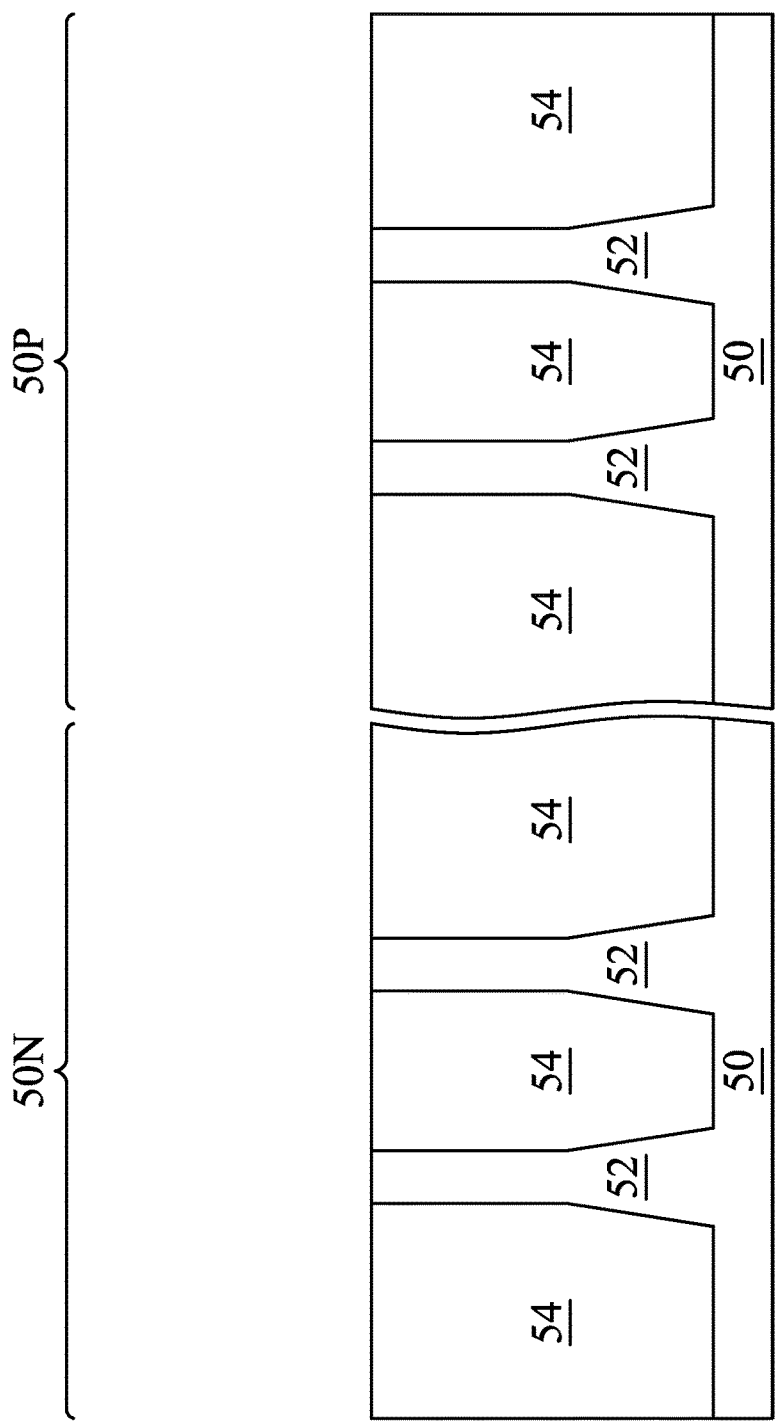

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
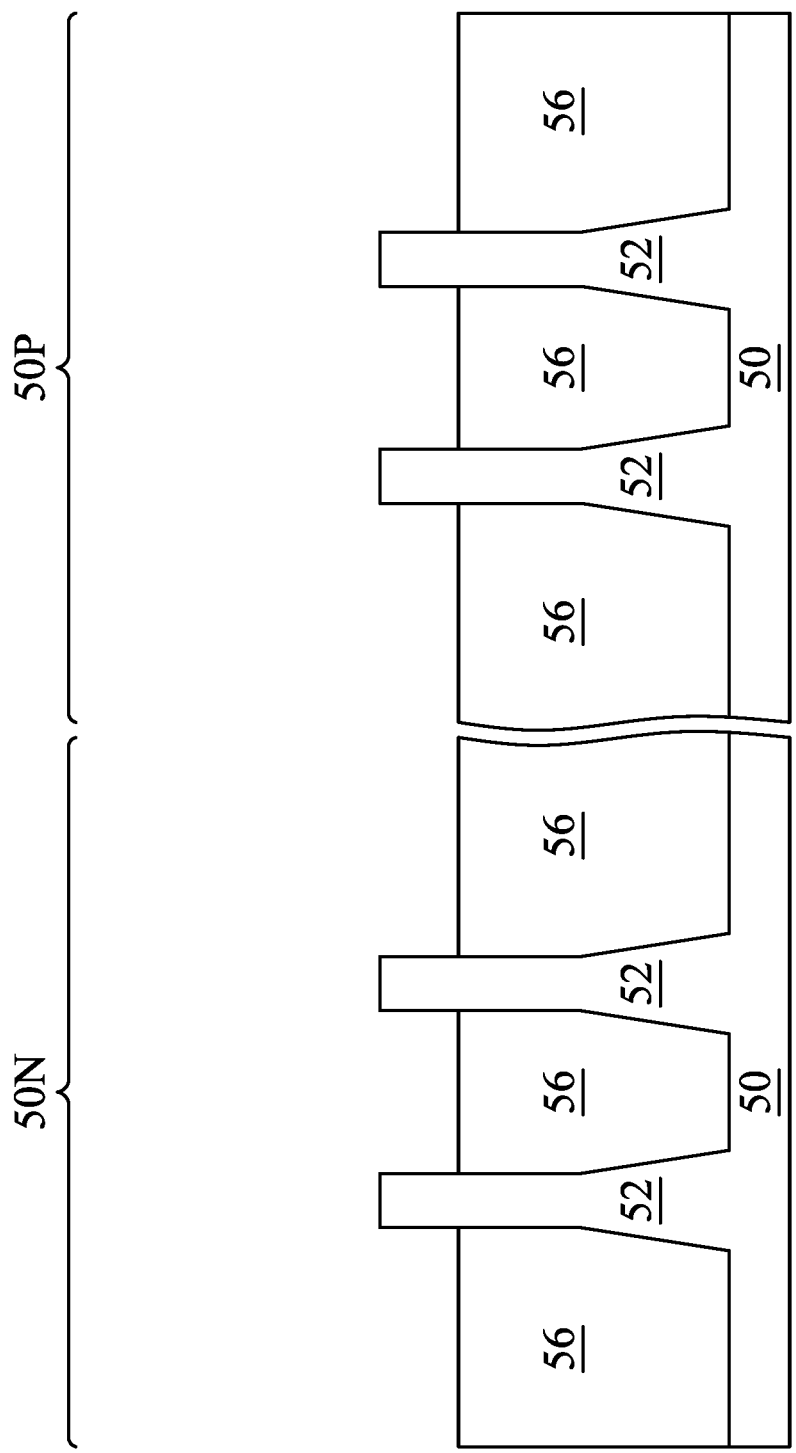

In FIG. 6, the insulation material 54 is recessed to form shallow trench isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins 52 may be formed by an epitaxial growth process. For example, a dielectric layer may be formed over a top surface of the substrate 50, and trenches may be etched through the dielectric layer to expose the underlying substrate 50. Homoepitaxial structures may be epitaxially grown in the trenches, and the dielectric layer may be recessed such that the homoepitaxial structures protrude from the dielectric layer to form the fins 52. Additionally, in some embodiments, heteroepitaxial structures may be used for the fins 52. For example, the fins 52 in FIG. 5 may be recessed, and a material different from the material of the fins 52 may be epitaxially grown over the recessed fins 52. In such embodiments, the fins 52 comprise the recessed material as well as the epitaxially grown material disposed over the recessed material. In an even further embodiment, a dielectric layer may be formed over a top surface of the substrate 50, and trenches may be etched through the dielectric layer. Heteroepitaxial structures may then be epitaxially grown in the trenches using a material different from the substrate 50, and the dielectric layer may be recessed such that the heteroepitaxial structures protrude from the dielectric layer to form the fins 52. In embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not separately illustrated) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not separately illustrated). For example, a photoresist may be formed over the fins 52 and the STI regions 56 in the region 50N. The photoresist is patterned to expose the region 50P of the substrate 50, such as a PMOS region. The photoresist may be formed by using a spin-on technique and may be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist may be formed by using a spin-on technique and may be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
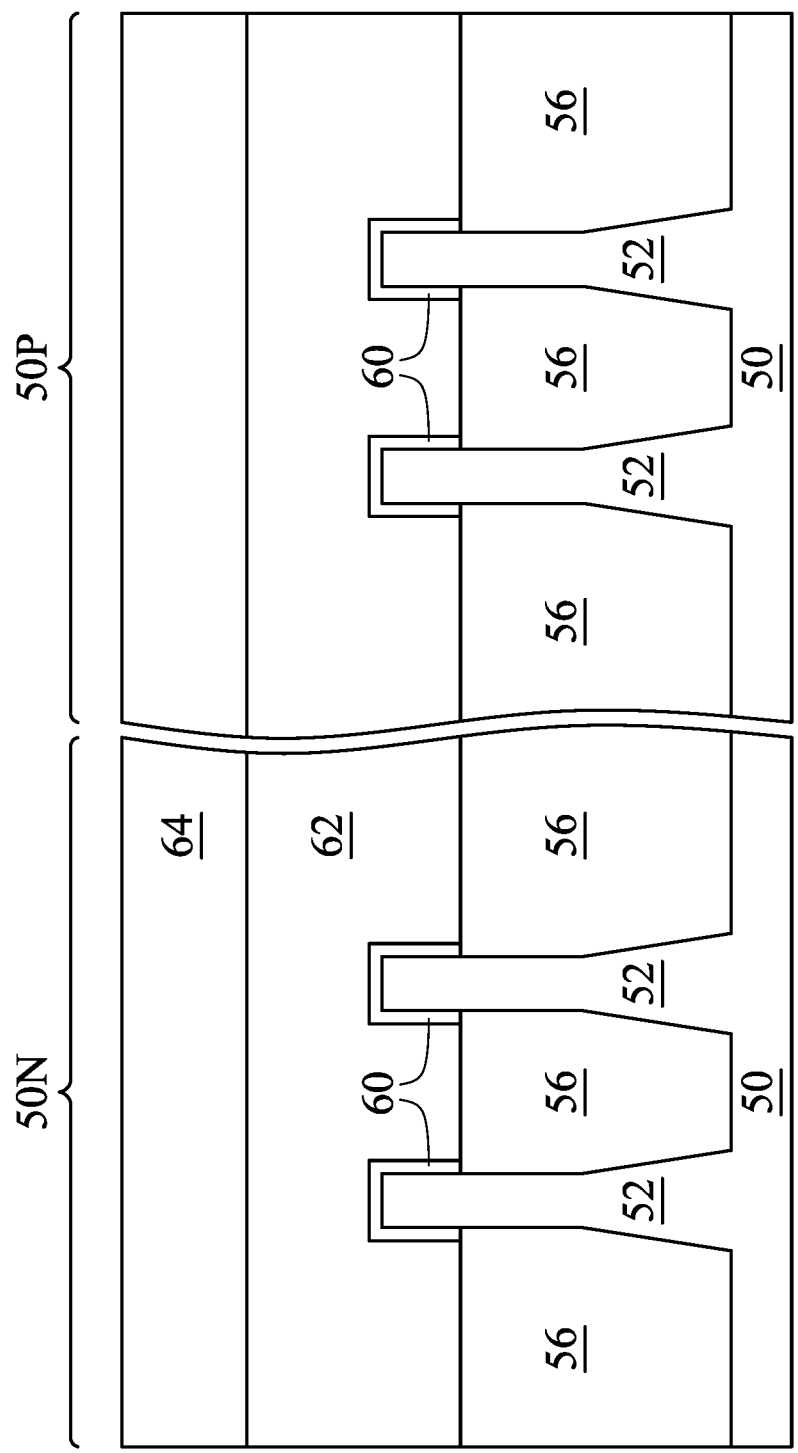

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized by a process such as CMP. The mask layer 64 may be deposited over the dummy gate layer 62. The dummy gate layer 62 may be a conductive or non-conductive material and may be selected from a group including amorphous silicon, polycrystalline-silicon (poly-silicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 12B and 14A through 20B illustrate various additional steps in the manufacturing of embodiment devices. FIGS. 8A through 12B and 14A through 20B illustrate features in either of the region 50N and the region 50P. For example, the structures illustrated in FIGS. 8A through 12B and 14A through 20B may be applicable to both the region 50N and the region 50P. Differences (if any) in the structures of the region 50N and the region 50P are described in the text accompanying each figure.

Figure 8B:
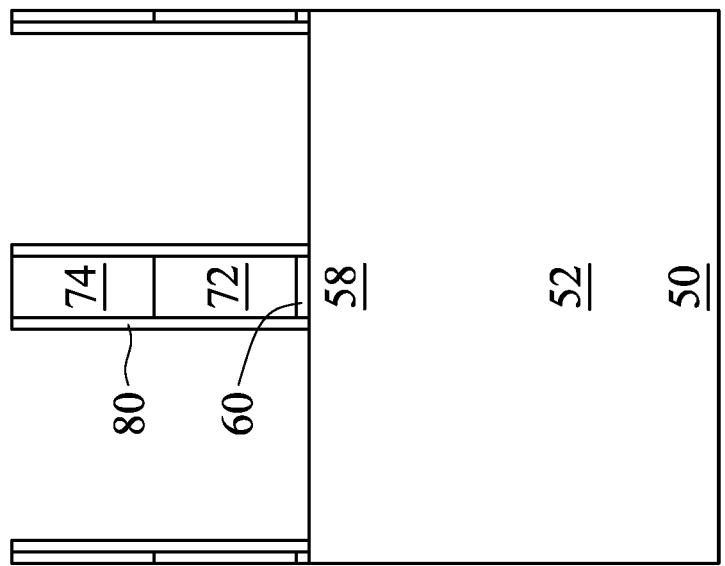
Figure 8A:
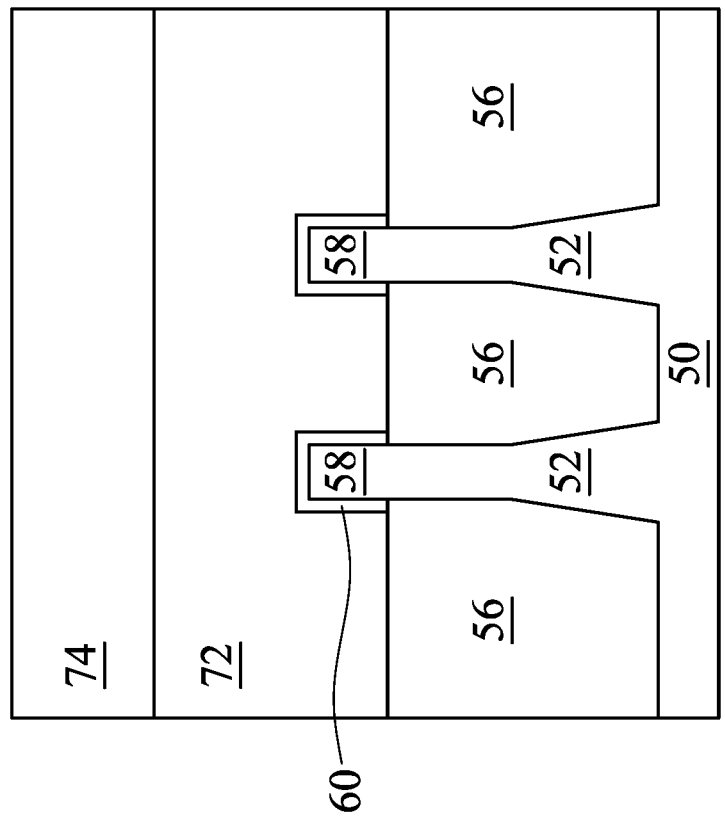

In FIGS. 8A and 8B, the mask layer 64 (see FIG. 7) may be patterned using acceptable photolithography and etching techniques to form masks 74. An acceptable etching technique may be used to transfer the pattern of the masks 74 to the dummy gate layer 62 to form dummy gates 72. In some embodiments, the pattern of the masks 74 may also be transferred to the dummy dielectric layer 60. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 may be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not separately illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The LDD regions may have a concentration of impurities of from about $10^{15}$ cm$^{-3}$ to about $10^{19}$ cm$^{-3}$. An anneal may be used to repair implant damage and to activate the implanted impurities.

Figure 9B:
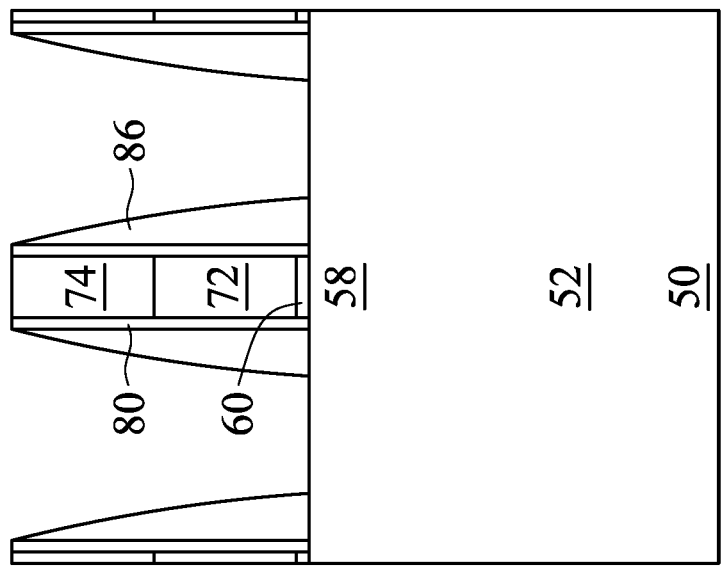
Figure 9A:
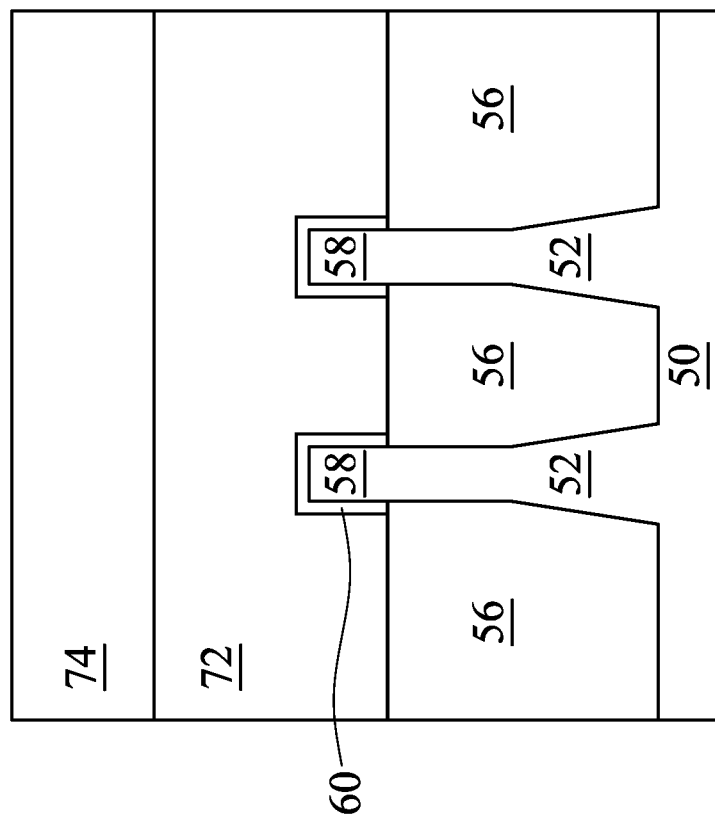

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
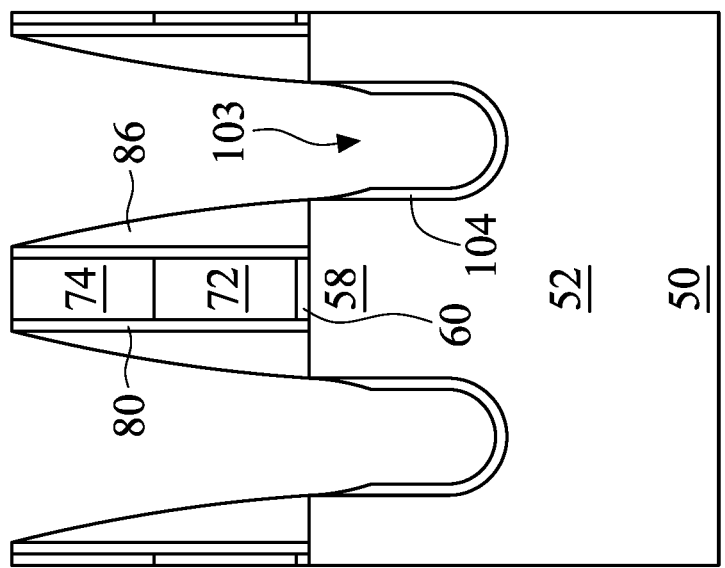
Figure 10A:
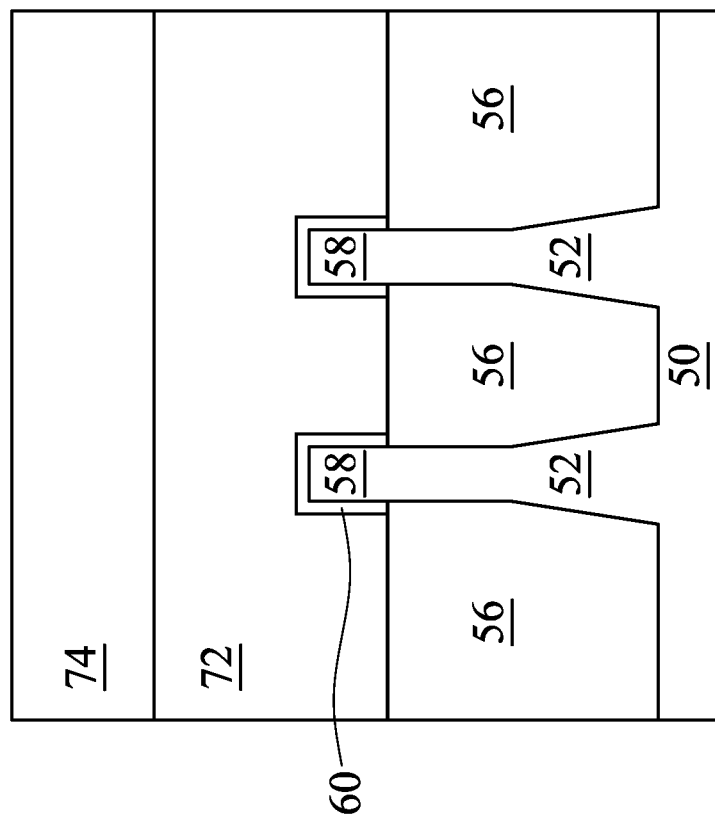

FIGS. 10A-12B illustrate a process for forming recesses 102 (illustrated in FIG. 12B) in the fins 52 between adjacent dummy gates 72. In FIGS. 10A and 10B, recesses 103 are formed in the fins 52. The recesses 103 may extend between neighboring gate spacers 86. The recesses 103 may be etched using a suitable etch process, such as an anisotropic dry etch process using the gate spacers 86, the gate seal spacers 80, and the masks 74 as a combined mask. In some embodiments, the recesses 103 may be etched using a reactive ion etch (RIE), a neutral beam etch (NBE), a combination thereof, or the like. In some embodiments where the RIE is used to form the recesses 103, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since the physical etching is anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, a combination thereof, or the like.

As illustrated in FIG. 10B, the recesses 103 may have U-shaped bottom surfaces. An etching residue 104 may remain on surfaces of the recesses 103 after the recesses are etched. The etching residue 104 may include a native oxide that forms along surfaces of the recesses 103, as well as carbon residues. The etching residue 104 may have a thickness from about 0.1 nm to about 1 nm. The etching residue 104 may increase electrical resistance and cause defects if present in a finished device after the epitaxial source/drain regions 82 are formed. As such, it is desirable to remove the etching residue 104.

In FIGS. 11A and 11B, a first etching process may be used to remove the etching residue 104 from the recesses 103. In some embodiments, the first etching process may use ammonia ($NH_3$) gas, nitrogen trifluoride ($NF_3$), combinations thereof, or the like, and may include a carrier gas, such as helium (He), or the like. The first etching process, in some instances, can reduce or remove the native oxide and the carbon residues of the etching residue 104 that may be formed on sidewalls and/or bottom surfaces of the recesses 103. A flow rate of the ammonia gas during the first etching process may be from about 100 sccm to about 200 sccm, a flow rate of nitrogen trifluoride during the first etching process may be from about 10 sccm to about 50 sccm, and a flow rate of the carrier gas during the first etching process may be from about 100 sccm to about 500 sccm. A temperature of the first etching process may be from about 100° C. to about 200° C. The first etching process may be performed at a pressure from about 1 Torr to about 5 Torr. The first etching process may be performed for a duration sufficient to physically clean the etching residue 104 from the recesses 103. For example, in some embodiments, the duration of the first etching process may be from about 10 seconds to about 50 seconds. Performing the first etching process for a short duration reduces the risk of damaging the profile of the recesses 103 or the dummy gates 72 during the first etching process. The first etching process may use different etchants and process parameters from the etchants and process parameters used to form the recess 103, discussed in reference to FIGS. 10A and 10B. Removing the etching residue 104 decreases electrical resistance in the subsequently formed epitaxial source/drain regions 82 and decreases defects in the finished device including the epitaxial source/drain regions 82.

Figure 12B:
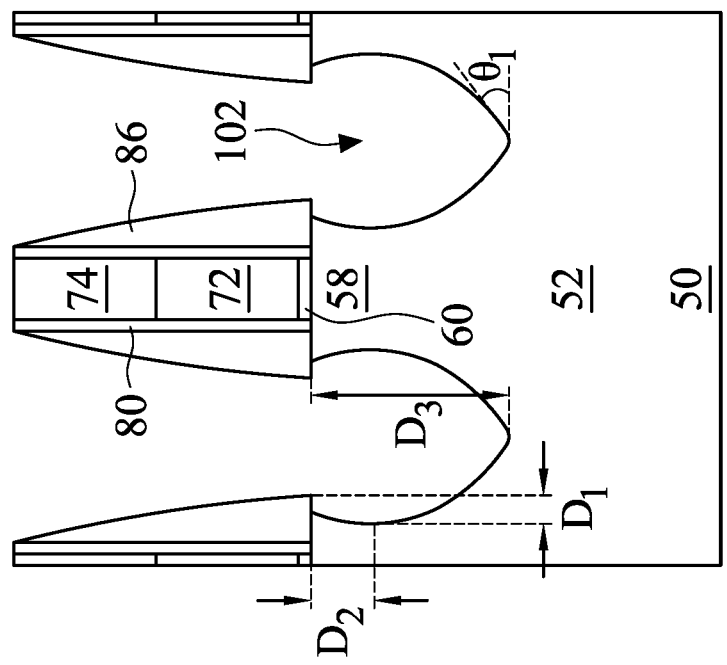
Figure 12A:
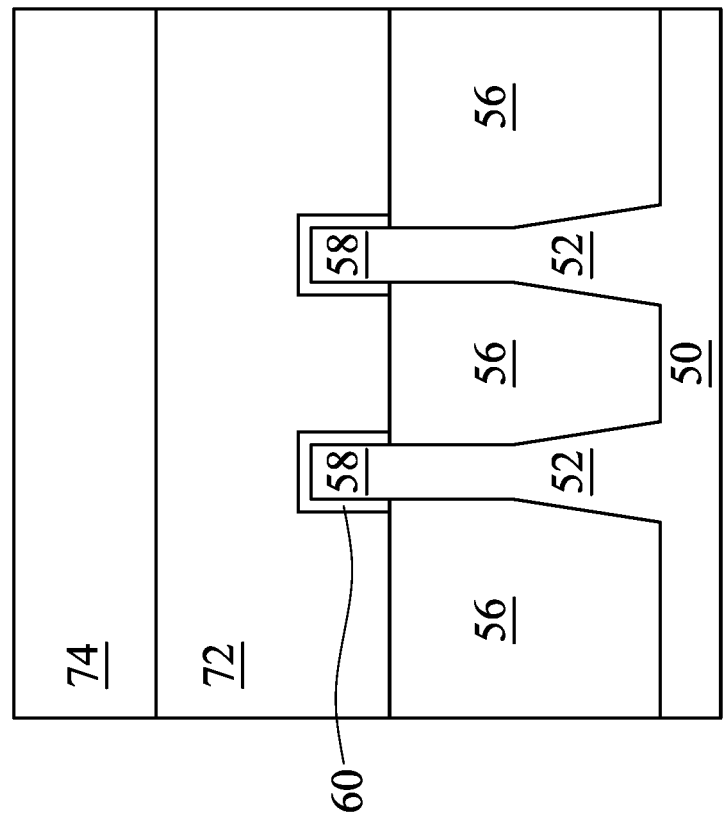

In FIGS. 12A and 12B, a second tool is used to expand the recesses 103 to form the recesses 102. The recesses 103 may be expanded by exposing the fins 52 to a second etching process. The second etching process removes portions of the fins 52 by exposing the fins 52 to hydrogen radicals (H•). Exposing the fins 52 to the hydrogen radicals may increase a hydrogen concentration in the fins 52 such that the hydrogen concentration in the fins 52 adjacent the recesses 102 may be from about $5 \times 10^{18}$ atoms/cm$^3$ to about $5 \times 10^{19}$ atoms/cm$^3$ after the fins 52 are exposed to the second etching process. The hydrogen radicals may be formed, for example, by flowing hydrogen ($H_2$) gas into a plasma generation chamber (e.g., the plasma generation chamber 223 illustrated in FIG. 13A) and igniting a plasma within the plasma generation chamber 223. In some embodiments, an additional gas may be ignited into a plasma within the plasma generation chamber 223, such as argon (Ar). In some embodiments, the substrate 50 may be placed in a processing chamber (e.g., the processing chamber 203 illustrated in FIG. 13A) and the plasma generation chamber 223 may be in a separate chamber connected to the processing chamber 203. In this manner, the plasma that is generated may be a remote plasma. An example system that may be used to perform the second etching process is described below in reference to FIGS. 13A-13B. The second etching process may be performed by the same tool or a different tool from the first etching process. In some embodiments, the first etching process and the second etching process may be performed using the same etchants and process parameters. The etchants and process parameters used to perform the first etching process and the second etching process may be different from the etchants and process parameters used to form the recesses 103, discussed in reference to FIGS. 10A and 10B. In still further embodiments, the first etching process may be optional and the second etching process may be used to remove the etching residues 104 and to expand the recesses 103 to form the recesses 102.

A flow rate of the hydrogen gas into a plasma generation chamber (e.g., a plasma generation chamber 223, illustrated in FIG. 13A) in the second etching process may be from about 50 sccm to about 200 sccm, and a flow rate of the carrier gas into the plasma generation chamber in the second etching process may be from about 100 sccm to about 500 sccm. Power from about 20 W to about 400 W may be supplied to the plasma generation chamber at a frequency of about 13.56 MHz or greater. The second etching process may be performed in a process chamber (e.g., a process chamber 203, illustrated in FIG. 13A) at a pressure from about 0.1 Torr to about 1 Torr and a temperature from about 250° C. to about 450° C. The second etching process may be performed in the process chamber for a period from about 10 seconds to about 200 seconds.

In some embodiments, the hydrogen radicals of the second etching process may preferentially etch some crystalline planes of the semiconductor material of the fins 52, and may therefore be anisotropic along the crystalline planes. As an example, for embodiments in which the material of the fins 52 is silicon, the hydrogen radicals may selectively etch (100) planes over (111) planes or (110) planes. In some embodiments, the etch rate of (100) planes may be about three times greater than the etch rate of (111) planes. Due to this selectivity, the etching by the hydrogen radicals may tend to slow or stop along (111) planes or (110) planes of silicon during the second etching process.

As illustrated in FIG. 12B, the recesses 102 may have V-shaped bottom surfaces. An angle $\theta_1$ between a bottom surface of one of the recesses 102 and a line parallel to a major surface of the substrate 50 may be from about 55° to about 65°, such as about 60°. The recesses 102 may extend under the gate spacers 86 a distance $D_1$ from about 4 nm to about 8 nm, such as about 6 nm. The distance $D_1$ may have a maximum value at a depth $D_2$ from about 20 nm to about 30 nm, such as about 25 nm, below a top surface of the fins 52. The recesses 102 may have a depth $D_3$ from about 40 nm to about 50 nm, such as about 45 nm.

Forming the recesses 102 extending under the gate spacers 86 and having V-shaped bottom surfaces allows for greater dopant diffusion from subsequently formed epitaxial source/drain regions 82 to the channel regions 58. This lowers the channel resistance $R_{ch}$. Moreover, the recesses 102 extending under the gate spacers 86 in the (110) direction provides a device boost, prevents drain induced barrier lowering (DIBL) effects, and improves $I_{on}$-$I_{off}$ (e.g., high on current $I_{on}$ and low leakage current $I_{off}$).

Figure 13A:
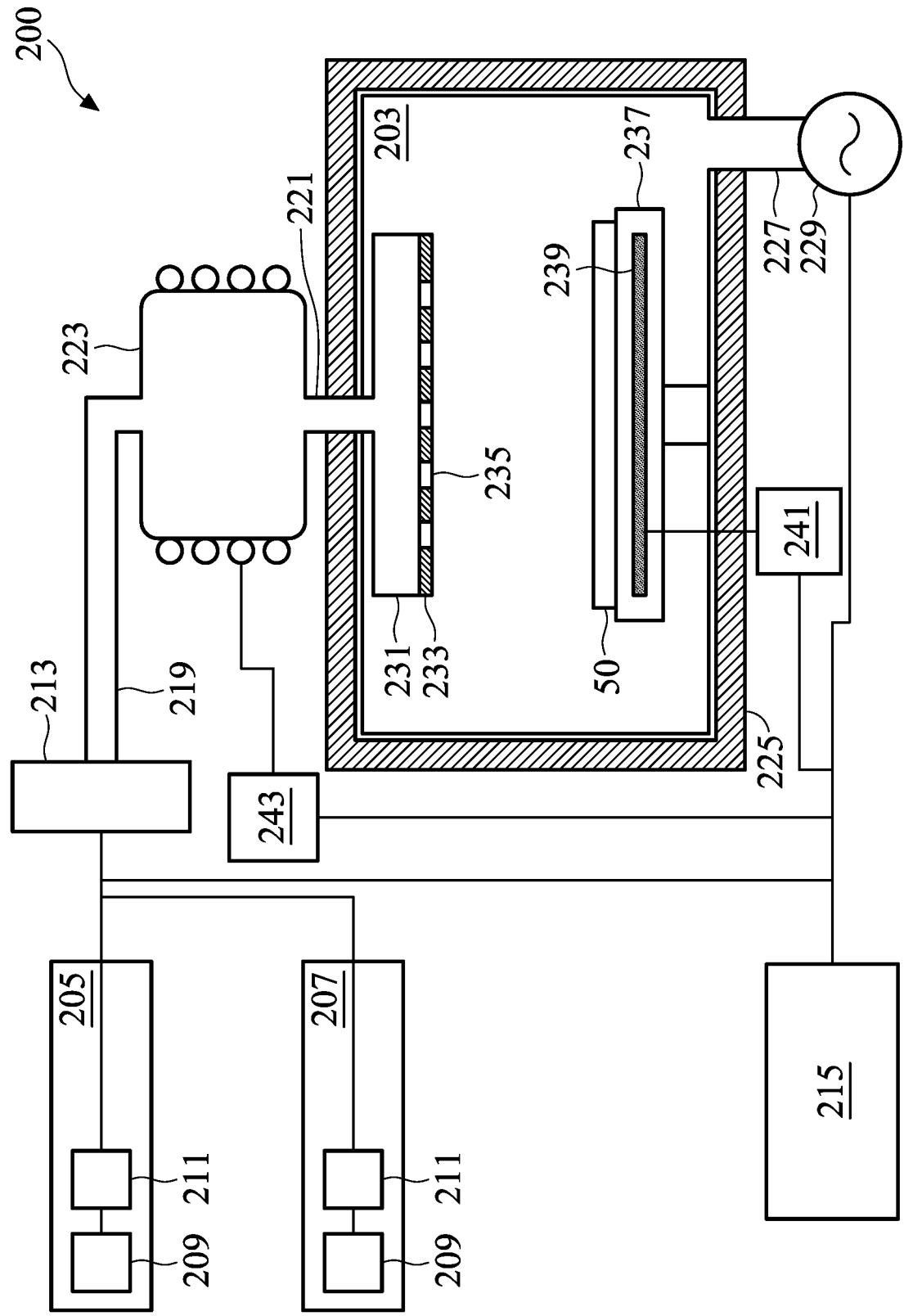
FIGS. 13A and 13B are schematic diagrams of a system for performing a plasma cleaning process, in accordance with some embodiments.
Figure 13B:
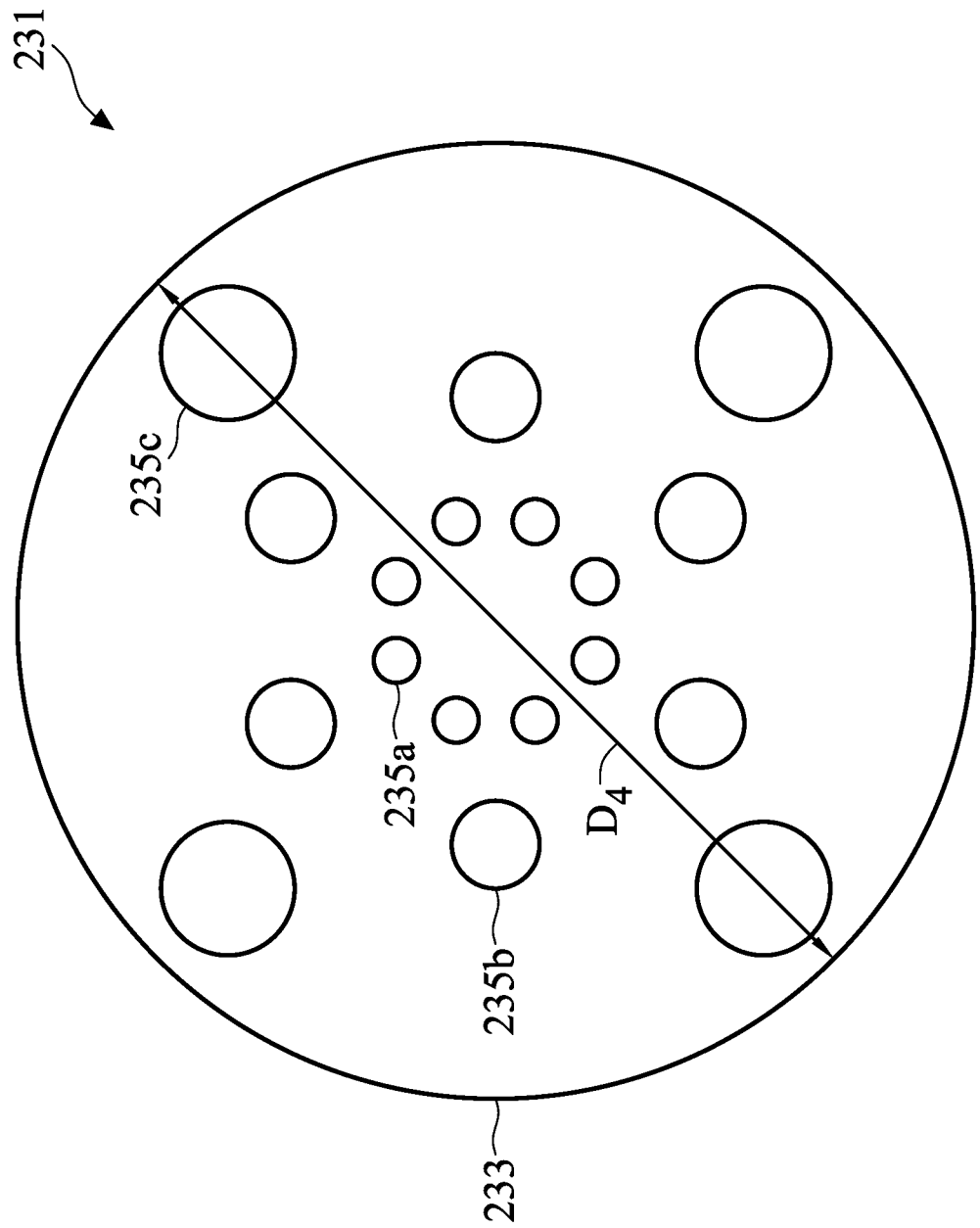

FIGS. 13A and 13B illustrate an etching system 200 that may be used to perform the second etching process. The etching system 200 includes a plasma generation chamber 223 connected to a process chamber 203. In an embodiment, the etching system 200 receives first process gases (e.g., $H_2$) from a first delivery system 205 and/or second process gases from a second delivery system 207. The first delivery system 205 and the second delivery system 207 may work in conjunction with one another to supply the various different process gases to the process chamber 203 wherein the substrate 50 is placed. The first delivery system 205 and the second delivery system 207 may have physical components that are similar to one another. In other embodiments, fewer or more delivery systems may be used.

In an embodiment, the first delivery system 205 and the second delivery system 207 may each include a gas supply 209 and a flow controller 211. The gas supply 209 may be a vessel, such as a gas storage tank, that is located either locally to the process chamber 203 or else may be located remotely from the process chamber 203. Alternatively, the gas supply 209 may be a facility that independently prepares and delivers the process gases to the flow controller 211. Any suitable source for the process gases may be utilized as the gas supply 209, and all such sources are fully intended to be included within the scope of the embodiments.

The gas supply 209 may supply the desired process gases to the flow controller 211. The flow controller 211 may be used to control the flow of the process gases to the gas controller 213 and, eventually, to the plasma generation chamber 223, thereby also helping to control the pressure within the plasma generation chamber 223. The flow controller 211 may be, e.g., a proportional valve, a modulating valve, a needle valve, a pressure regulator, a mass flow controller, combinations of these, or the like. However, any suitable method for controlling and regulating the flow of the process gases may be used, and all such components and methods are fully intended to be included within the scope of the embodiments.

While the first delivery system 205 and the second delivery system 207 have been described herein as having identical components, this is merely an illustrative example and is not intended to limit the embodiments in any fashion. Any type of suitable process gas delivery system, with any type and number of individual components the same as or different from any of the other delivery systems within the etching system 200, may alternatively be utilized. All such delivery systems are fully intended to be included within the scope of the embodiments.

In various embodiments, the process gases may constitute a precursor mixed with a carrier gas. In embodiments in which the precursor is stored in a solid or liquid state, the gas supply 209 may store the carrier gas and the carrier gas may be introduced into a precursor canister (not separately illustrated), which stores the precursor in the solid or liquid state. The carrier gas is then used to push and carry the precursor as it evaporates or sublimates into a gaseous section of the precursor canister before being sent to the gas controller 213. Any suitable method and combination of units may be utilized to provide the precursor, and all such combination of units are fully intended to be included within the scope of the embodiments. The carrier gas may include nitrogen ($N_2$), helium (He), argon (Ar), xenon (Xe), combinations of these, or the like, although other suitable carrier gases may alternatively be used.

The first delivery system 205 and the second delivery system 207 may supply their individual process gases into the gas controller 213. The gas controller 213 connects and isolates the first delivery system 205 and the second delivery system 207 from the plasma generation chamber 223 in order to deliver the desired process gases to the plasma generation chamber 223. The gas controller 213 may include such devices as valves, flow meters, sensors, and the like to control the delivery rates of each of the process gases, and may be controlled by instructions received from a control unit 215.

The gas controller 213, upon receiving instructions from the control unit 215, may open and close valves so as to connect one or more of the first delivery system 205 or the second delivery system 207 to the plasma generation chamber 223 and direct a desired process gas through a manifold 219 into the plasma generation chamber 223.

In some embodiments, the plasma generation chamber 223 may include a transformer coupled plasma generator and may be, e.g., a coil. The coil may be attached to a first RF generator 243 that is used to provide power to the plasma generation chamber 223 (under control of the control unit 215) in order to ignite the plasma during introduction of the process gases and/or carrier gases. However, while the plasma generation chamber 223 is described above as including a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be used. All such methods are fully intended to be included within the scope of the embodiments.

The process chamber 203 further includes a showerhead 231 that is connected to the plasma generation chamber 223 by a conduit 221. The conduit 221 allows plasma products from the plasma generation chamber 223 (e.g., H radicals (H•) or other plasma products) to be transported into the showerhead 231. The showerhead 231 may be used to disperse the plasma products into the process chamber 203, and may be designed to evenly disperse the plasma products in order to minimize undesired process conditions that may arise from uneven dispersal. In an embodiment, the showerhead 231 may include a gas distribution plate (GDP) 233, which may have multiple openings 235 to allow for the dispersal of the plasma products into the process chamber 203.

FIG. 13B illustrates an embodiment of the showerhead 231. The showerhead 231 illustrated in FIG. 13B may be configured to evenly distribute plasma products (e.g., hydrogen radicals) evenly within the process chamber 203. In existing showerheads, the distribution of plasma products exiting a conduit into the showerhead remains concentrated near an axis aligned with the conduit. For example, the plasma products may be more concentrated near the center of the showerhead. Thus, because of the uneven distribution of plasma products exiting the showerhead the plasma products may impinge on a substrate such as the substrate 50 unevenly, causing uneven etching or cleaning during the second etching process. As such, the showerhead 231 is provided to more evenly distribute the plasma products impinging the substrate 50.

In FIG. 13B, the GDP 233 includes openings 235, which include three sizes of openings 235a, 235b, and 235c. The openings 235 may have diameters which become larger from the center of the GDP 233 towards the edges of the GDP 233 and opening distributions which decrease from the center of the GDP 233 to the edges of the GDP 233. As illustrated in FIG. 13B, the openings 235a may be disposed in the center of the GDP 233 and have the smallest diameter, the openings 235b may encircle the openings 235a and have an intermediate diameter, and the openings 235c may encircle the openings 235b and have the largest diameter. The openings 235a have a diameter from about 5 mm to about 15 mm, such as about 10 mm; the openings 235b have a diameter from about 25 mm to about 35 mm, such as about 30 mm; and the openings 235c have a diameter from about 40 mm to about 60 mm, such as about 50 mm. Moreover, the openings 235a have a greater distribution than the openings 235b, which in turn have a greater distribution than the openings 235c. For example, the openings 235a may have a distribution from about 4 openings/cm$^2$ to about 8 openings/cm$^2$, the openings 235b may have a distribution from about 2 openings/cm$^2$ to about 6 openings/cm$^2$, and the openings 235c may have a distribution from about 1 openings/cm$^2$ to about 4 openings/cm$^2$. In some embodiments, the GDP 233 may have a diameter $D_4$ from about 100 mm to about 200 mm. The openings 235a may be disposed within a circle having a diameter up to about 20 mm; the openings 235b may be disposed within an annular ring having an inner diameter from about 20 mm to about 50 mm and an outer diameter from about 50 mm to about 80 mm; and the openings 235c may be disposed within an annular ring having an inner diameter from about 80 mm to about 130 mm and an outer diameter from about 130 mm to about 180 mm.

The larger size of openings 235c near the edge of the GDP 233 allow more hydrogen radicals within the showerhead 231 to exit the showerhead 231 near the edge of the GDP 233. The smaller size of openings 235a near the center of the GDP 233 allow fewer plasma products within the showerhead 231 to exit the showerhead 231 near the center of the GDP 233. Additionally, including a greater distribution of the openings 235a near the center of the GDP 233 than the distribution of the openings 235c near the edges of the GDP 233 allows more plasma products to exit the showerhead 231 near the center of the GDP 233 than the edges of the GDP 233. Together, the sizes and the distributions of the openings allow the plasma products that enter the showerhead 231 from the conduit 221 to exit the showerhead 231 with an even distribution. For example, a flowrate of the plasma products near an edge of the showerhead 231 (e.g., within 50 mm of the edge of the showerhead 231) may be within 70 percent of a flowrate of the plasma products near a center of the showerhead 231 (e.g., within 20 mm of the center of the showerhead 231). The openings 235 illustrated in FIG. 13B including the openings 235a, 235b, and 235c are meant as an illustrative example. The number of the openings 235, the arrangement of the openings 235, the number of different sizes of the openings 235, the arrangement of the openings 235, the relative sizes of the openings 235, and other characteristics (e.g., shape, spacing, distribution, etc.) of the openings 235 may be different in other embodiments without deviating from the scope of this disclosure.

However, the introduction of plasma products to the process chamber 203 through a single showerhead 231 or through a single point of introduction as described above is intended to be illustrative only and is not intended to be limiting to the embodiments. Any number of separate and independent showerheads 231 or other openings to introduce plasma products into the process chamber 203 may alternatively be used. All such combinations of showerheads and other points of introduction are fully intended to be included within the scope of the embodiments.

Returning to FIG. 13A, the process chamber 203 may receive the plasma products and expose the substrate 50 to the plasma products. The process chamber 203 may be any desired shape that may be suitable for dispersing the plasma products and contacting the plasma products with the substrate 50. The process chamber 203 may be surrounded by a housing 225 made of material that is inert to the various process materials. As such, while the housing 225 may be any suitable material that can withstand the chemistries and pressures involved in the deposition process, in an embodiment the housing 225 may be steel, stainless steel, nickel, aluminum, alloys of these, ceramic, combinations of these, or the like.

Within the process chamber 203, the substrate 50 may be placed on a mounting platform 237 in order to position and control the substrate 50 during the deposition processes. While a single mounting platform 237 is illustrated in FIG. 13A, any number of mounting platforms 237 may additionally be included within the process chamber 203. Additionally, multiple wafers or substrate 50 may be placed on a single mounting platform 237.

In some embodiments, the mounting platform 237 may be formed from a material that is suited to tolerate relatively high process temperatures. For example, the mounting platform 237 may be made from an aluminum nitride material (e.g., $AlN_x$), another metal alloy material, or another suitable material. The mounting platform 237 may be configured to evenly distribute heat to a wafer or the substrate 50 mounted on the mounting platform 237.

The mounting platform 237 may additionally include a first electrode 239 coupled to a second RF generator 241. The first electrode 239 may be electrically biased by the second RF generator 241 (under control of the control unit 215) at a RF voltage during the second etching process or other processes.

The process chamber 203 may also have an exhaust outlet 227 for exhaust material to exit the process chamber 203. A vacuum pump 229 may be connected to the exhaust outlet 227 of the process chamber 203 in order to help evacuate the exhaust material. The vacuum pump 229, under control of the control unit 215, may also be utilized to reduce and control the pressure within the process chamber 203 to a desired pressure and may also be used to evacuate exhaust materials or reaction byproducts from the process chamber 203.

In FIGS. 14A and 14B, once the recesses 102 have been formed, the epitaxial source/drain regions 82 are formed in the fins 52, filling the recesses 102, to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region. Then, the epitaxial source/drain regions 82 in the region 50N are epitaxially grown in the recesses 102. The epitaxial source/drain regions 82 in the region 50N, e.g., the NMOS region, may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form the recesses 102 in the fins 52. Then, the epitaxial source/drain regions 82 in the region 50P are epitaxially grown in the recesses 102. The epitaxial source/drain regions 82 in the region 50P, e.g., the PMOS region, may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The epitaxial source/drain regions 82 may have an impurity concentration of between about $10^{19}$ $cm^{-3}$ and about $10^{21}$ $cm^{-3}$. The n-type and/or p-type impurities for epitaxial source/drain regions 82 may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 14C. In other embodiments, adjacent epitaxial source/drain regions 82 remain separated after the epitaxy process is completed as illustrated by FIG. 14D. In the embodiments illustrated in FIGS. 14C and 14D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 15B:
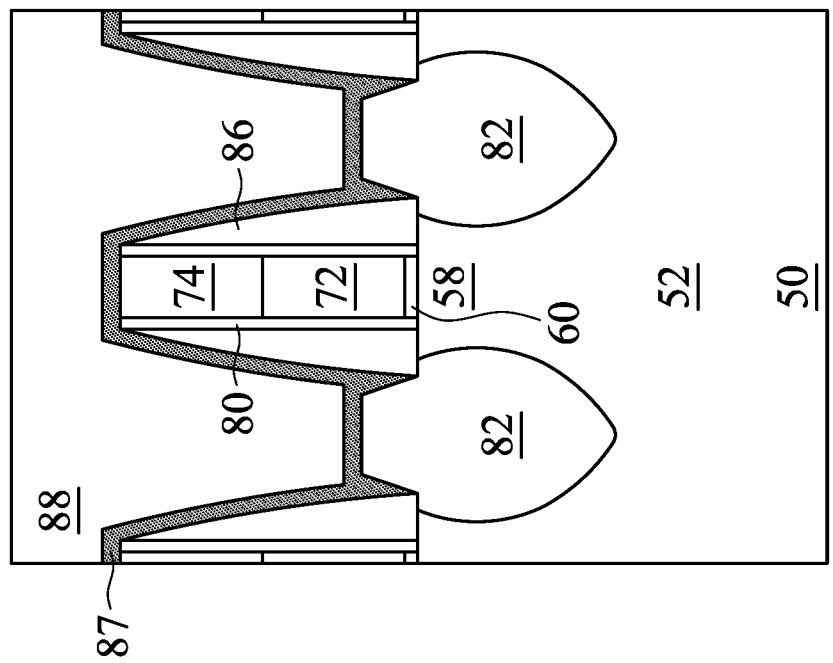
Figure 15A:
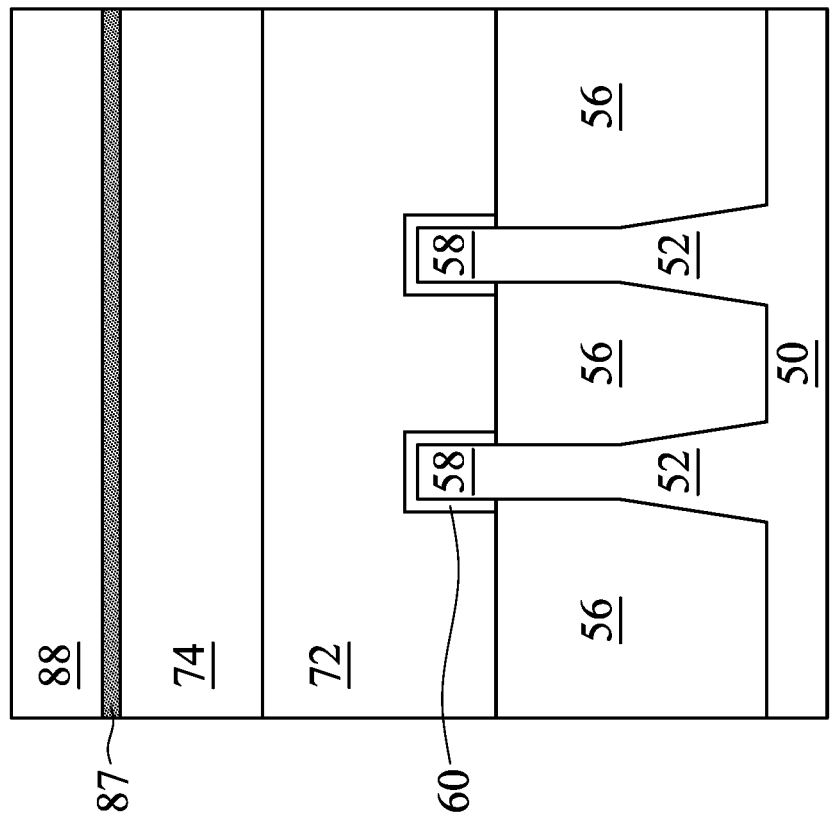

In FIGS. 15A and 15B, a first interlayer dielectric (ILD) 88 is deposited over the structure illustrated in FIGS. 14A and 14B. The first ILD 88 may be formed of a dielectric material, and may be deposited by any suitable method, such as CVD, plasma-enhanced CVD (PECVD), or FCVD. Dielectric materials may include phosphosilicate glass (PSG), borosilicate glass (BSG), boron-doped phosphosilicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 16B:
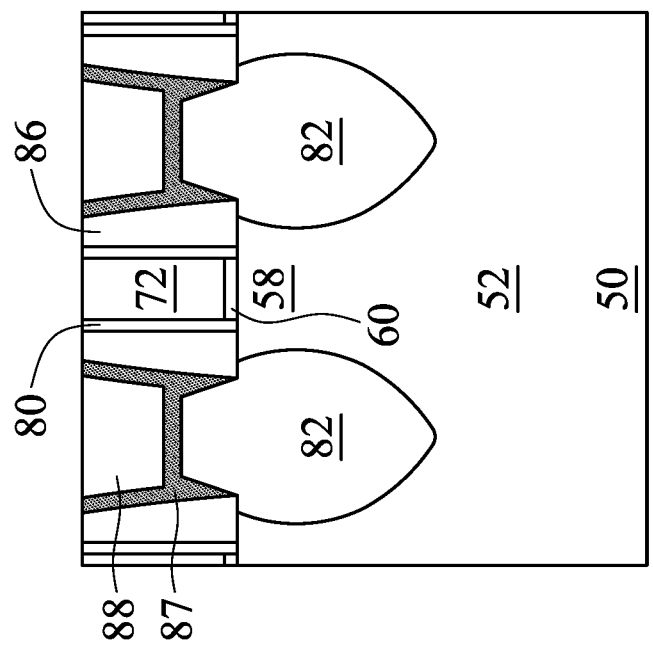
Figure 16A:
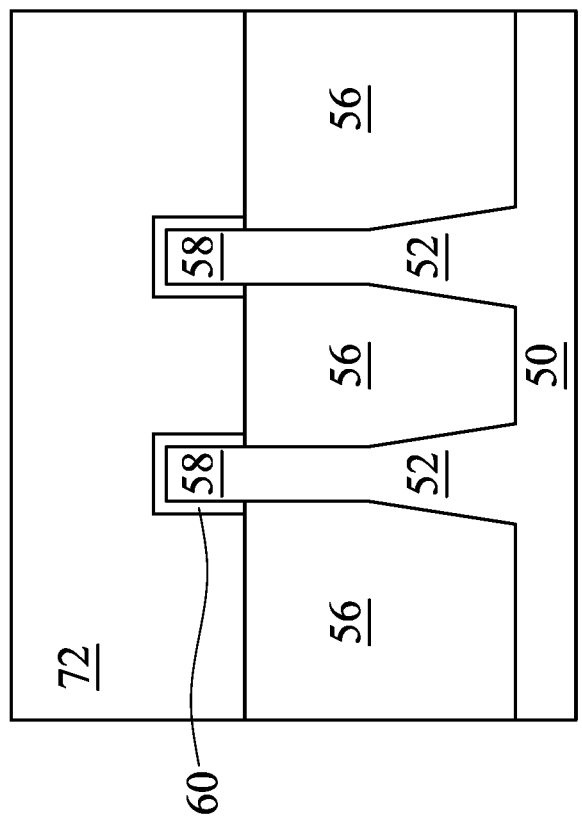

In FIGS. 16A and 16B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 17B:
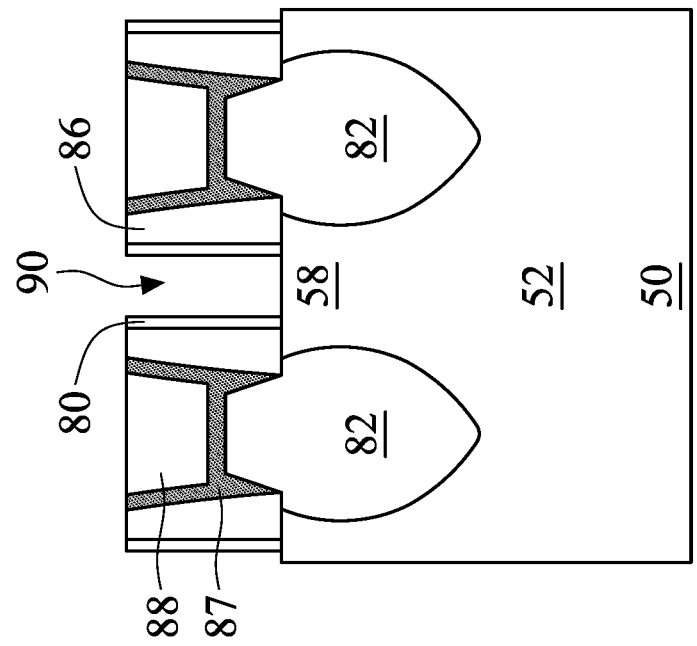
Figure 17A:
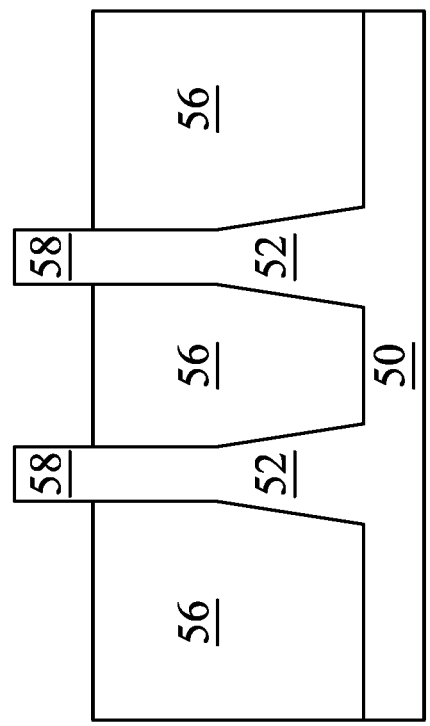

In FIGS. 17A and 17B, the dummy gates 72, and the masks 74, if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 18B:
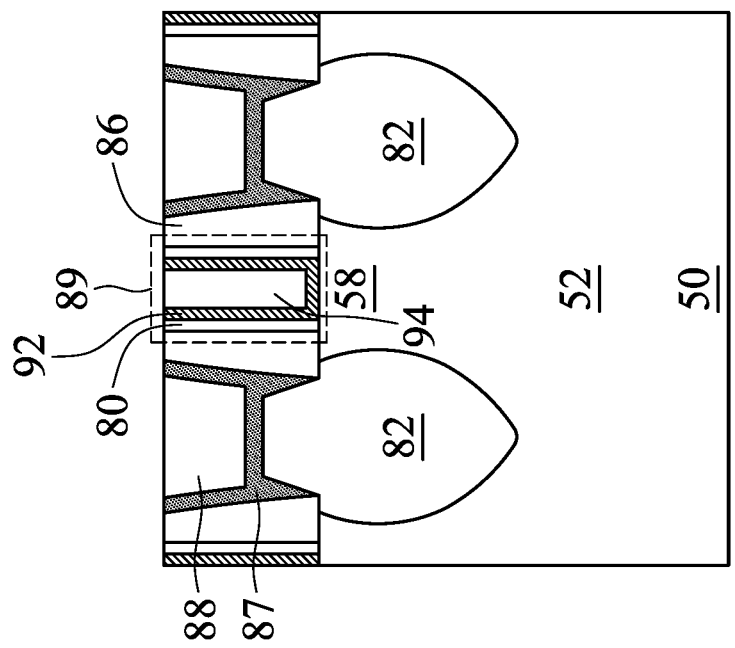
Figure 18A:
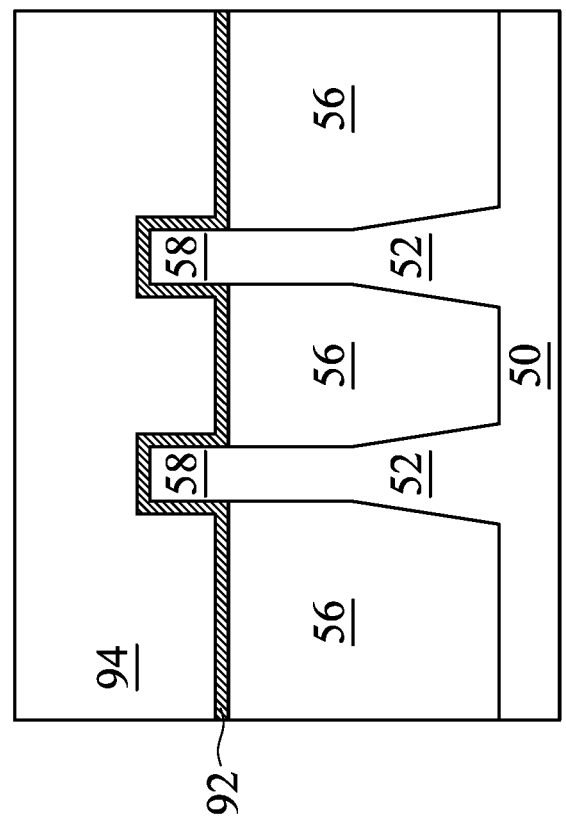
Figure 18C:
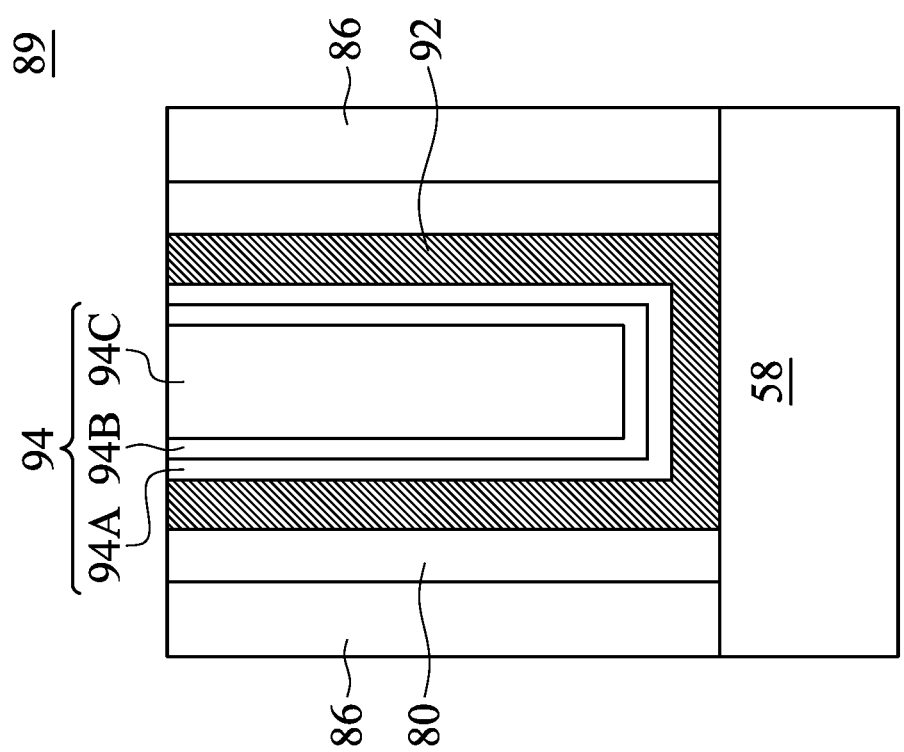

In FIGS. 18A and 18B, gate dielectric layers 92 and gate electrodes 94 are formed for replacement gates. FIG. 18C illustrates a detailed view of region 89 of FIG. 18B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include molecular-beam deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 18B, the gate electrode 94 may comprise any number of liner layers 94A, any number of work function tuning layers 94B, and a fill material 94C as illustrated by FIG. 18C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 19B:
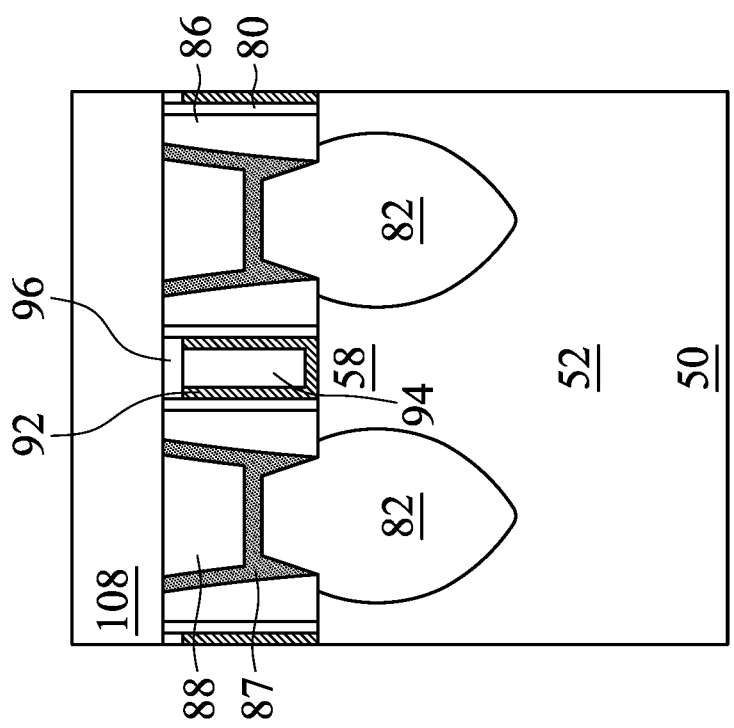
Figure 19A:
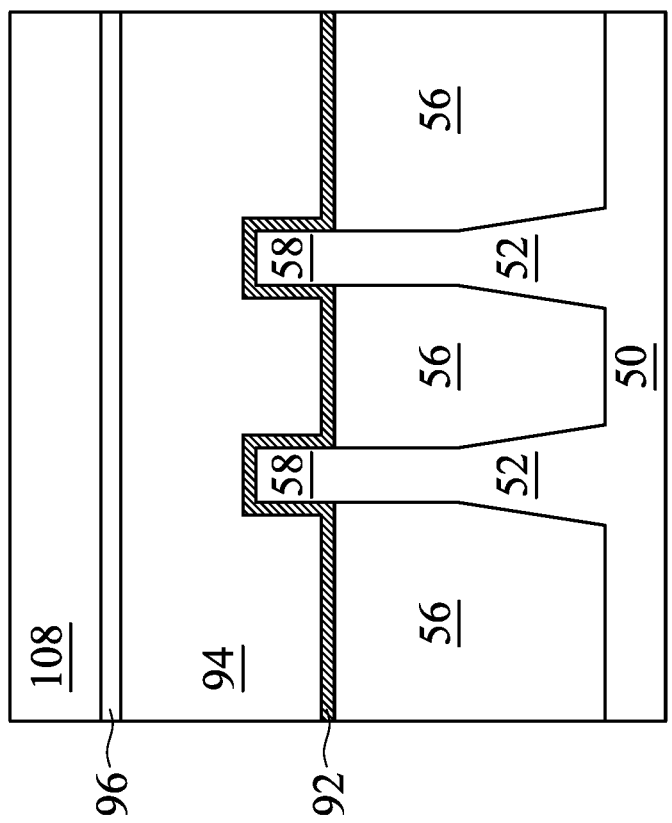

In FIGS. 19A and 19B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 19A and 19B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (illustrated in FIGS. 20A and 20B) penetrate through the gate mask 96 to contact the top surface of the recessed gate electrode 94.

Figure 20B:
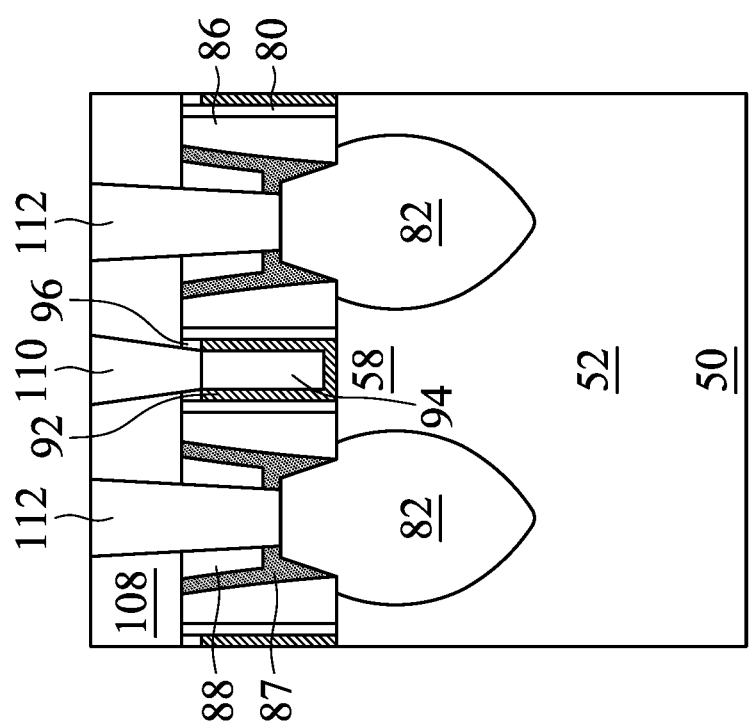
Figure 20A:
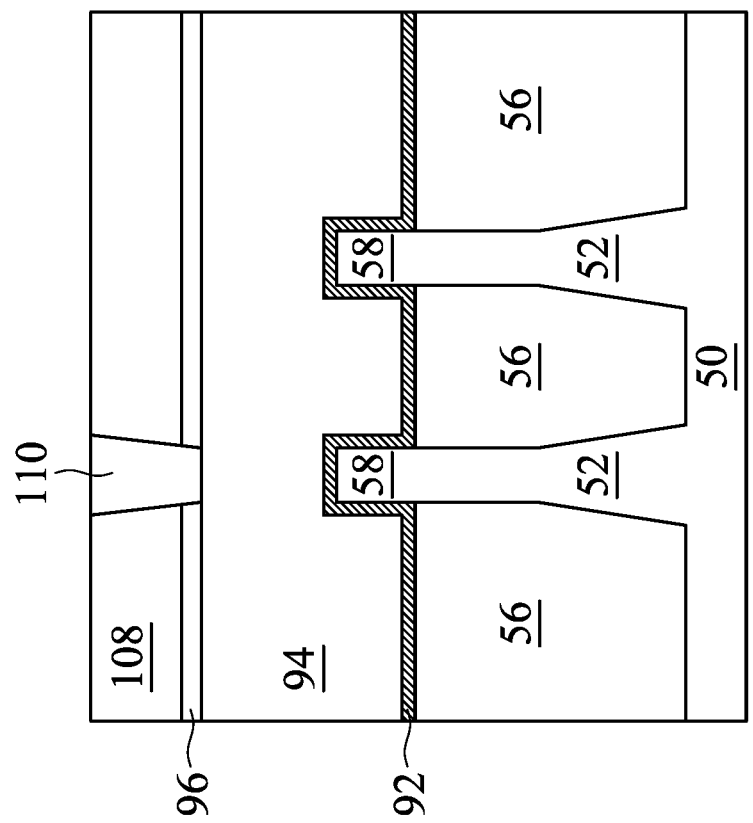

In FIGS. 20A and 20B, gate contacts no and source/drain contacts 112 are formed through the second ILD 108, the first ILD 88, and the gate mask 96 in accordance with some embodiments. Openings for the source/drain contacts 112 are formed through the first ILD 88 and the second ILD 108, and openings for the gate contact no are formed through the second ILD 108 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts no in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts no are physically and electrically coupled to the gate electrodes 94. The source/drain contacts 112 and gate contacts no may be formed in different processes, or may be formed in the same process. Although shown as being formed in the same cross-sections, it should be appreciated that each of the source/drain contacts 112 and gate contacts no may be formed in different cross-sections, which may avoid shorting of the contacts.

As discussed above, removing the etching residue 104 reduces device defects and improves device performance. Forming the recesses 102, filled by the epitaxial source/drain regions 82, having V-shaped bottom surfaces allows for greater dopant diffusion from subsequently formed epitaxial source/drain regions 82 to the channel regions 58, lowering the channel resistance $R_{ch}$ in the channel regions 58. Moreover, forming the recesses 102, filled by the epitaxial source/drain regions 82, extending underneath the gate spacers 86 provides a device boost, prevents drain induced barrier lowering (DIBL) effects, and improves $I_{on}$-$I_{off}$ (e.g., high on current $I_{on}$ and low leakage current $I_{off}$). As such, devices formed in accordance with the above-described methods have improved device performance and reduced device defects.

In accordance with an embodiment, a method includes forming a gate stack over a fin extending from a substrate; forming a gate spacer on a sidewall of the gate stack; etching the fin with a first etch process to form a first recess adjacent the gate spacer, the first etch process being anisotropic; etching the fin with a second etch process to remove an etching residue from the first recess, the second etch process using etchants different from the first etch process; etching surfaces of the first recess with a third etch process to form a second recess, the second recess extending below the gate spacer in a direction perpendicular to a major surface of the substrate, the second recess having a V-shaped bottom surface, the third etch process being anisotropic along crystalline planes of the substrate, the third etch process using etchants different from the first etch process; and epitaxially forming a source/drain region in the second recess. In an embodiment, the etching residue includes a native oxide or a carbon residue. In an embodiment, the second etch process is an ammonia-based etch process. In an embodiment, the second etch process is performed at a temperature from 100° C. to 200° C. In an embodiment, the third etch process is a hydrogen-based plasma etch process. In an embodiment, the first etch process is a reactive ion etch. In an embodiment, the etchants used for the second etch process are the same as the etchants used for the third etch process. In an embodiment, the etching the surfaces of the first recess with the third etch process includes flowing hydrogen radicals through a showerhead, the showerhead having a higher density of openings near a center of the showerhead than near edges of the showerhead.

In accordance with another embodiment, a device includes a fin extending from a substrate; a gate stack over the fin; a gate spacer on a sidewall of the gate stack; and a source/drain region in the fin adjacent the gate spacer, the source/drain region having a V-shaped bottom surface in a (111) crystal plane, the source/drain region extending under the gate spacer in a direction parallel to a major surface of the substrate and in a (110) crystal plane, the source/drain region extending at least 4 nm to 8 nm under the gate spacer in the direction parallel to the major surface of the substrate at a depth from 20 nm to 30 nm. In an embodiment, an angle between the V-shaped bottom surface of the source/drain region and a line parallel to the major surface of the substrate is from 55° to 65°. In an embodiment, the source/drain region extends from 40 to 50 nm below the major surface of the substrate. In an embodiment, a concentration of hydrogen in the fin adjacent the source/drain region is from $5\times10^{18}$ atoms/cm$^3$ to $5\times10^{19}$ atoms/cm$^3$.

In accordance with yet another embodiment, a method includes forming a fin in a semiconductor substrate; forming a dummy gate stack over the fin; etching the fin adjacent the dummy gate stack using a first etch process to form a first recess, the first etch process anisotropically etching the fin in a direction perpendicular to a major surface of the semiconductor substrate; after etching the fin using the first etch process, removing an etch residue from the first recess; etching the first recess using a second etch process to form a second recess, the second etch process being anisotropic along a (111) crystal plane and along a (110) crystal plane; forming a source/drain region in the second recess; and replacing the dummy gate stack with a gate stack. In an embodiment, the second etch process removes the etch residue. In an embodiment, the second etch process includes a hydrogen-based plasma etch. In an embodiment, the removing the etch residue from the first recess uses an ammonia-based etch process, the etching the first recess using the second etch process is performed after the removing the etch residue from the first recess, and the etching the first recess using the second etch process uses a hydrogen-based plasma etch process. In an embodiment, the ammonia-based etch process is performed at a temperature from 100° C. to 200° C., and the hydrogen-based plasma etch process is performed at a temperature from 250° C. to 450° C. In an embodiment, the method further includes forming gate spacers adjacent the dummy gate stack, sidewalls of the first recess being coterminous with sidewalls of the gate spacers after etching the fin using the first etch process, and sidewalls of the second recess extending underneath the gate spacers in the direction perpendicular to the major surface of the semiconductor substrate after etching the first recess using the second etch process. In an embodiment, the etch residue includes a native oxide or a carbon residue. In an embodiment, the etch residue has a thickness from 0.1 nm to 1 nm after the etching the fin adjacent the dummy gate stack using the first etch process and before the removing the etch residue from the first recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a gate stack over a fin extending from a substrate;
    forming a gate spacer on a sidewall of the gate stack;
    etching the fin with a first etch process to form a first recess adjacent the gate spacer, wherein the first etch process is anisotropic;
    etching the fin with a second etch process to remove an etching residue from the first recess, the second etch process using etchants different from the first etch process;
    etching surfaces of the first recess with a third etch process to form a second recess, the second recess extending below the gate spacer in a (100) crystal plane in a direction perpendicular to a major surface of the substrate, the second recess having a V-shaped bottom surface, wherein the third etch process is anisotropic along (100) crystalline planes of the substrate, the third etch process using etchants different from the first etch process; and
    epitaxially forming a source/drain region in the second recess.

2. The method of claim 1, wherein the etching residue comprises a native oxide or a carbon residue.

3. The method of claim 1, wherein the second etch process is an ammonia-based etch process.

4. The method of claim 3, wherein the second etch process is performed at a temperature from 100° C. to 200° C.

5. The method of claim 1, wherein the third etch process is a hydrogen-based plasma etch process.

6. The method of claim 1, wherein the first etch process is a reactive ion etch.

7. The method of claim 1, wherein the etchants used for the second etch process are the same as the etchants used for the third etch process.

8. The method of claim 1, wherein the etching the surfaces of the first recess with the third etch process comprises flowing hydrogen radicals through a showerhead, the showerhead having a higher density of openings near a center of the showerhead than near edges of the showerhead.

9. A device comprising:
a fin extending from a substrate;
a gate stack over the fin;
a gate spacer on a sidewall of the gate stack; and
a source/drain region in the fin adjacent the gate spacer, the source/drain region having a V-shaped bottom surface in a (111) crystal plane, the source/drain region extending under the gate spacer in a direction parallel to a major surface of the substrate and in a (110) crystal plane, wherein the source/drain region extends at least 4 nm to 8 nm under the gate spacer in the direction parallel to the major surface of the substrate at a depth from 20 nm to 30 nm.

10. The device of claim 9, wherein an angle between the V-shaped bottom surface of the source/drain region and a line parallel to the major surface of the substrate is from 55° to 65°.

11. The device of claim 9, wherein the source/drain region extends from 40 to 50 nm below the major surface of the substrate.

12. The device of claim 9, wherein a concentration of hydrogen in the fin adjacent the source/drain region is from $5 \times 10^{18}$ atoms/cm$^3$ to $5 \times 10^{19}$ atoms/cm$^3$.

13. A method comprising:
forming a fin in a semiconductor substrate;
forming a dummy gate stack over the fin;
etching the fin adjacent the dummy gate stack using a first etch process to form a first recess, the first etch process anisotropically etching the fin in a direction perpendicular to a major surface of the semiconductor substrate;
after etching the fin using the first etch process, removing an etch residue from the first recess;
etching the first recess using a second etch process to form a second recess, the second etch process being anisotropic along a (iii) crystal plane and along a (no) crystal plane;
forming a source/drain region in the second recess; and
replacing the dummy gate stack with a gate stack.

14. The method of claim 13, wherein the second etch process removes the etch residue.

15. The method of claim 14, wherein the second etch process comprises a hydrogen-based plasma etch.

16. The method of claim 13, wherein the removing the etch residue from the first recess uses an ammonia-based etch process, wherein the etching the first recess using the second etch process is performed after the removing the etch residue from the first recess, and wherein the etching the first recess using the second etch process uses a hydrogen-based plasma etch process.

17. The method of claim 16, wherein the ammonia-based etch process is performed at a temperature from 100° C. to 200° C., and wherein the hydrogen-based plasma etch process is performed at a temperature from 250° C. to 450° C.

18. The method of claim 13, further comprising forming gate spacers adjacent the dummy gate stack, wherein sidewalls of the first recess are coterminous with sidewalls of the gate spacers after etching the fin using the first etch process, and wherein sidewalls of the second recess extend underneath the gate spacers in the direction perpendicular to the major surface of the semiconductor substrate after etching the first recess using the second etch process.

19. The method of claim 13, wherein the etch residue comprises a native oxide or a carbon residue.

20. The method of claim 13, wherein the etch residue has a thickness from 0.1 nm to 1 nm after the etching the fin adjacent the dummy gate stack using the first etch process and before the removing the etch residue from the first recess.

* * * * *

UNITED STATES PATENT AND TRADEMARK OFFICE
CERTIFICATE OF CORRECTION

PATENT NO. : 11,063,152 B2  
APPLICATION NO. : 16/547191  
DATED : July 13, 2021  
INVENTOR(S) : Chien-Wei Lee Page 1 of 1

It is certified that error appears in the above-identified patent and that said Letters Patent is hereby corrected as shown below:

In the Claims

In Claim 13, Column 20; Line 5 delete "(iii)" insert --(111)--

In Claim 13, Column 20; Line 5 delete "(no)" insert --(110)--

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*